(12) United States Patent
Woodruff et al.

(10) Patent No.: US 7,198,694 B2
(45) Date of Patent: *Apr. 3, 2007

(54) INTEGRATED TOOL WITH INTERCHANGEABLE WET PROCESSING COMPONENTS FOR PROCESSING MICROFEATURE WORKPIECES AND AUTOMATED CALIBRATION SYSTEMS

(75) Inventors: Daniel J. Woodruff, Kalispell, MT (US); Jeffry Alan Davis, Kalispell, MT (US); Randy A. Harris, Kalispell, MT (US); David P. Mattson, Kalispell, MT (US); James J. Erickson, Kalispell, MT (US); Matthew C. Egloff, Butte, MT (US)

(73) Assignee: Semitool, Inc., Kalispell, MT (US)

( * ) Notice: Subject to any disclaimer, the term of this patent is extended or adjusted under 35 U.S.C. 154(b) by 185 days.

This patent is subject to a terminal disclaimer.

(21) Appl. No.: 10/861,240

(22) Filed: Jun. 3, 2004

(65) Prior Publication Data

US 2005/0034809 A1    Feb. 17, 2005

Related U.S. Application Data

(60) Provisional application No. 60/501,566, filed on Sep. 9, 2003, provisional application No. 60/476,786, filed on Jun. 6, 2003, provisional application No. 60/476,776, filed on Jun. 6, 2003.

(51) Int. Cl.
*C23F 1/00* (2006.01)
*H01L 21/306* (2006.01)
*C25C 7/00* (2006.01)
*B05C 9/00* (2006.01)

(52) U.S. Cl. ............... 156/345.31; 156/345.22; 204/267; 204/271; 118/620

(58) Field of Classification Search ........... 156/345.31, 156/156, 345.32; 118/719; 414/939; 204/242, 204/271
See application file for complete search history.

(56) References Cited

U.S. PATENT DOCUMENTS

| | | | | | |
|---|---|---|---|---|---|
| 4,722,298 | A | * | 2/1988 | Rubin et al. | 118/715 |
| 5,083,364 | A | * | 1/1992 | Olbrich et al. | 29/564 |
| 5,733,024 | A | * | 3/1998 | Slocum et al. | 312/223.2 |
| 6,091,498 | A | * | 7/2000 | Hanson et al. | 356/623 |
| 6,178,361 | B1 | * | 1/2001 | George et al. | 700/213 |
| 6,312,522 | B1 | * | 11/2001 | Dinh et al. | 118/407 |
| 6,900,132 | B2 | | 5/2005 | Thompson et al. | |
| 6,962,471 | B2 | * | 11/2005 | Birkner et al. | 414/217 |
| 2001/0032788 | A1 | * | 10/2001 | Woodruff et al. | 205/687 |

OTHER PUBLICATIONS

International Search Report and Written Opinion for PCT/US04/17760; Applicant: Semitool, Inc.; dated Mar. 16, 2006; 15 pgs.

* cited by examiner

*Primary Examiner*—Karla Moore
(74) *Attorney, Agent, or Firm*—Perkins Cole LLP

(57) ABSTRACT

An integrated tool and automatic calibration systems that enable wet chemical processing chambers, lift-rotate units and other hardware to be quickly interchanged without having to recalibrate the transport system or other components to the replacement items. These tools are expected to reduce the down time associated with repairing or maintaining processing chambers and/or lift-rotate units so that the tools can maintain a high throughput. Several aspects of these tools are particularly useful for applications that have stringent performance requirements because components are more likely to require maintenance more frequently, and reducing the down time associated with maintaining such components will significantly enhance the integrated tool.

29 Claims, 29 Drawing Sheets

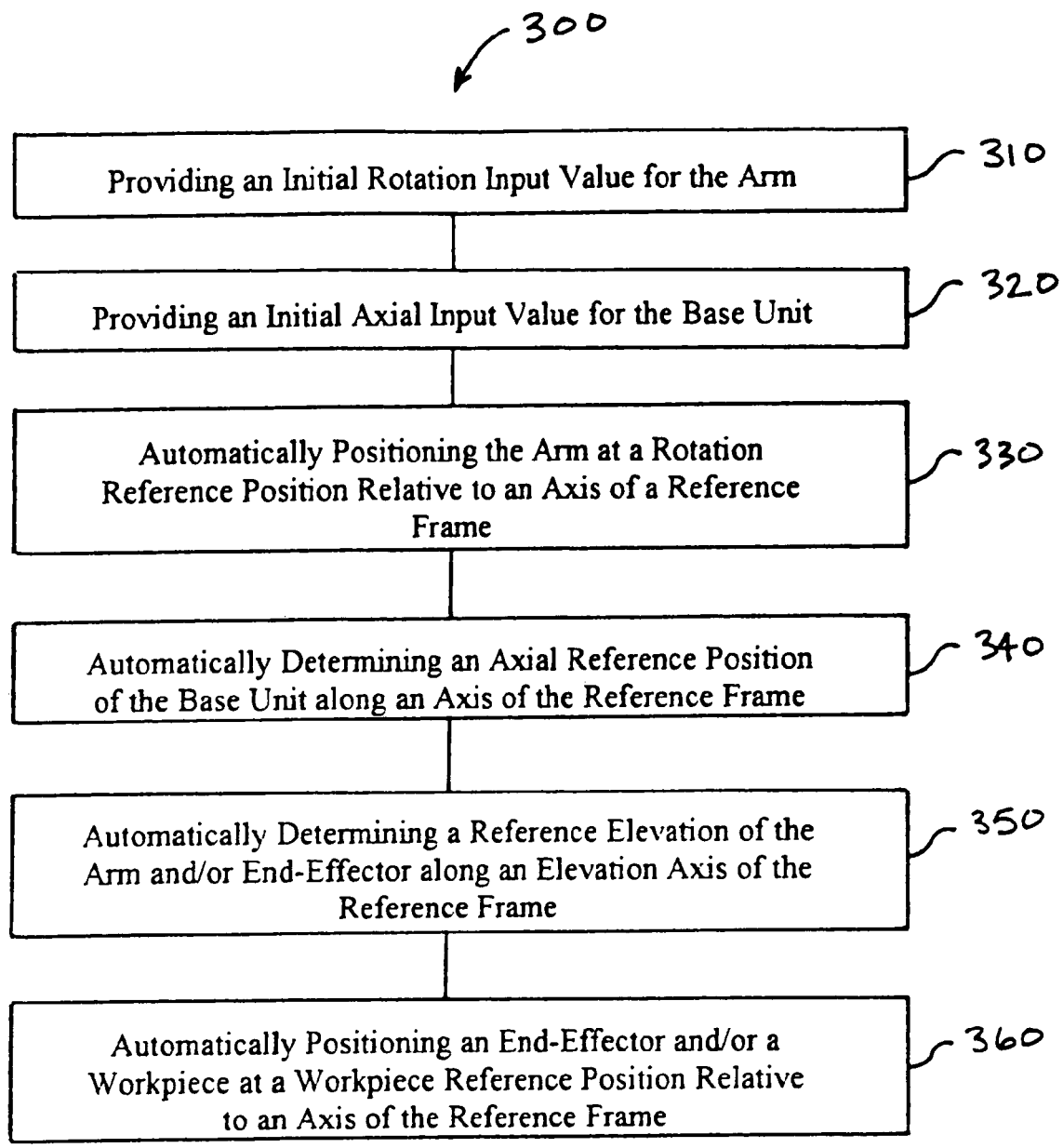
Fig. -12-

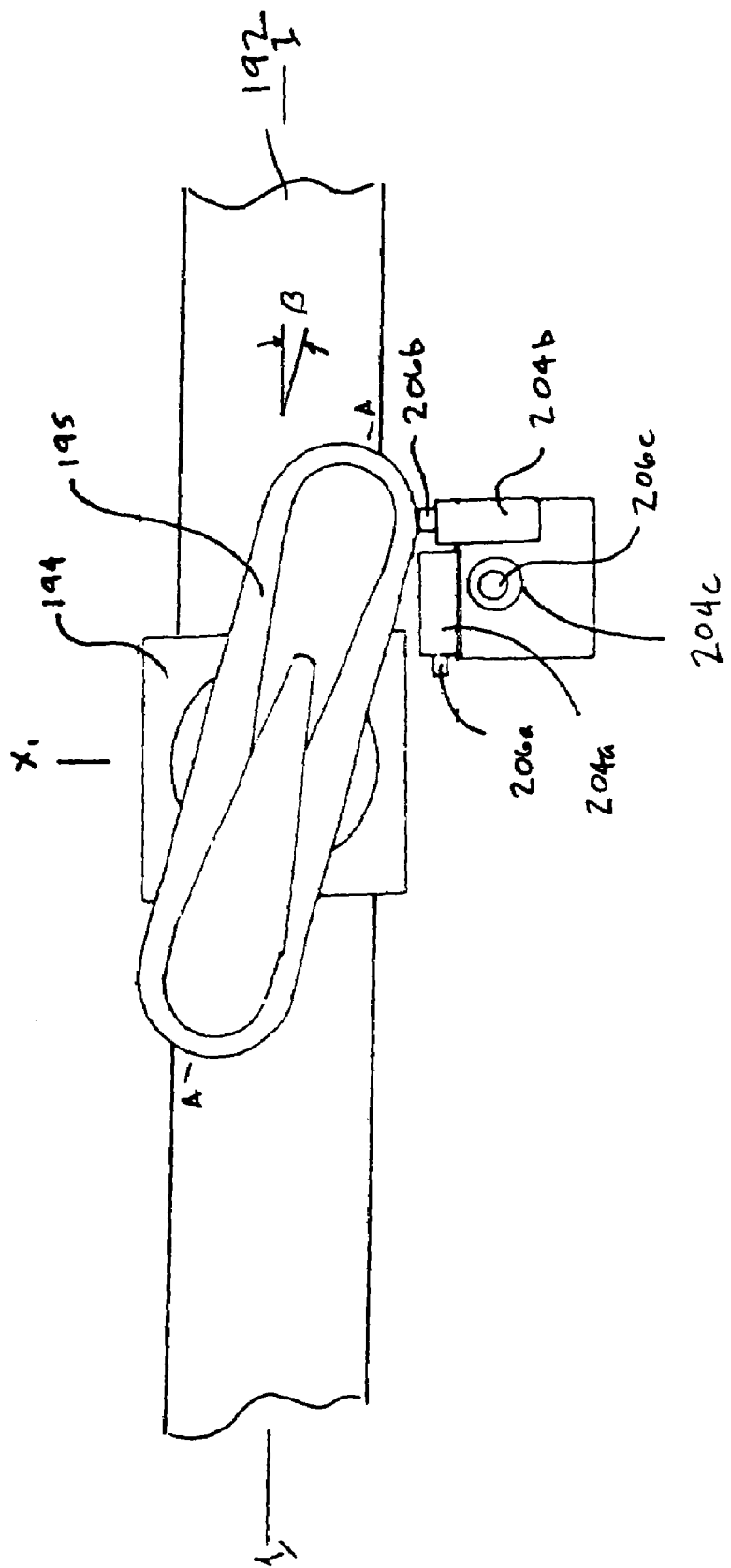

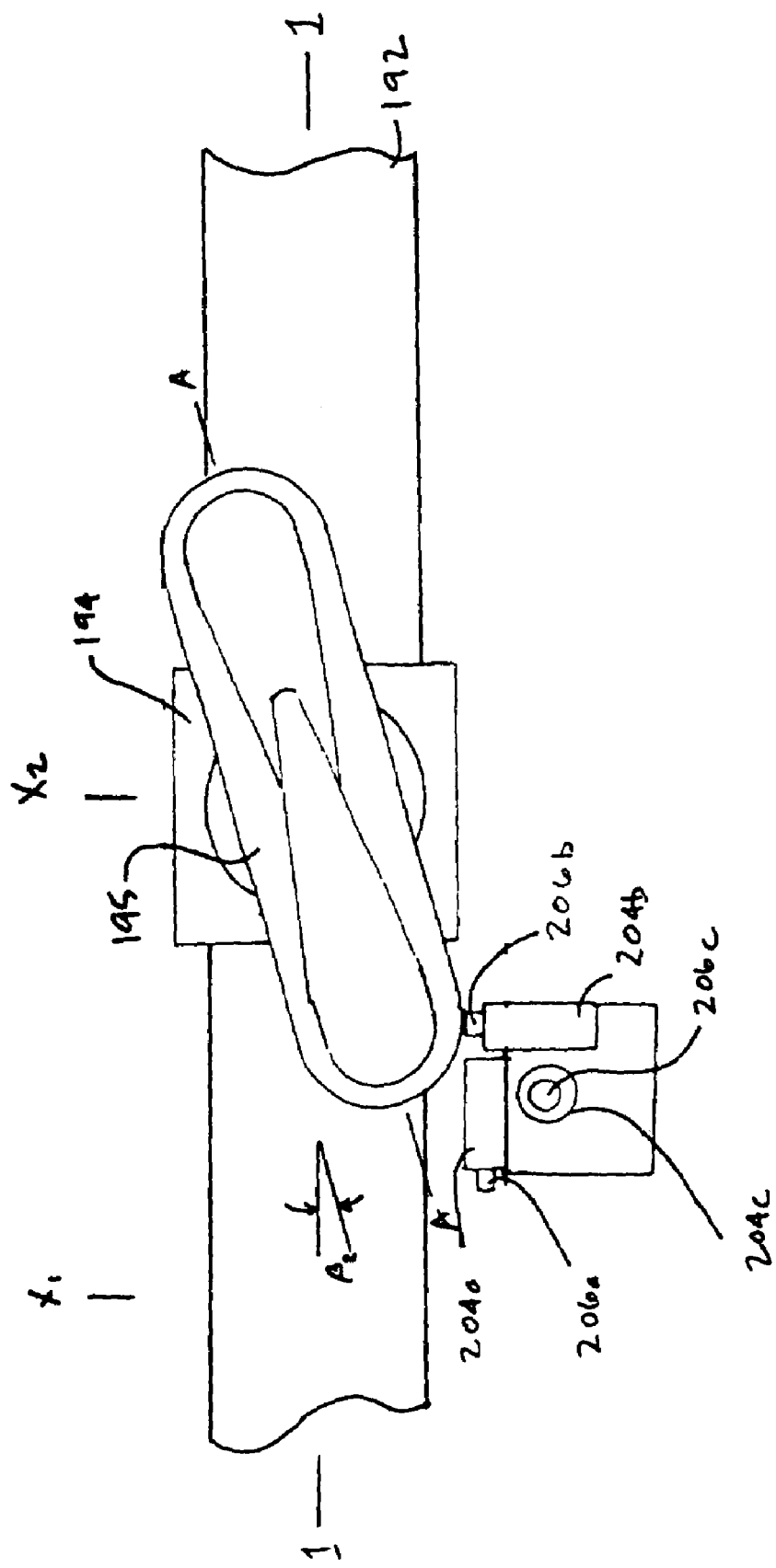

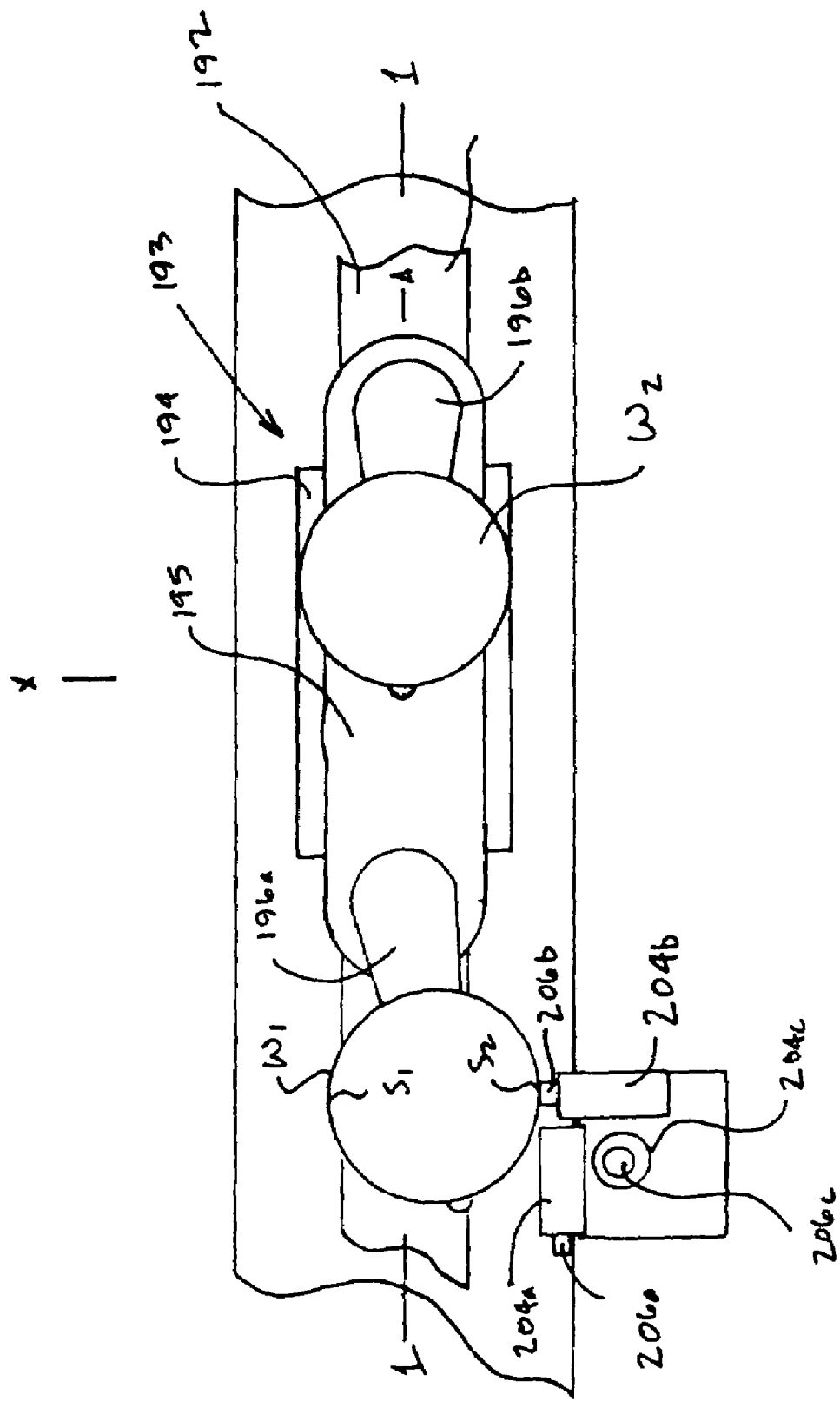
Fig.—16B

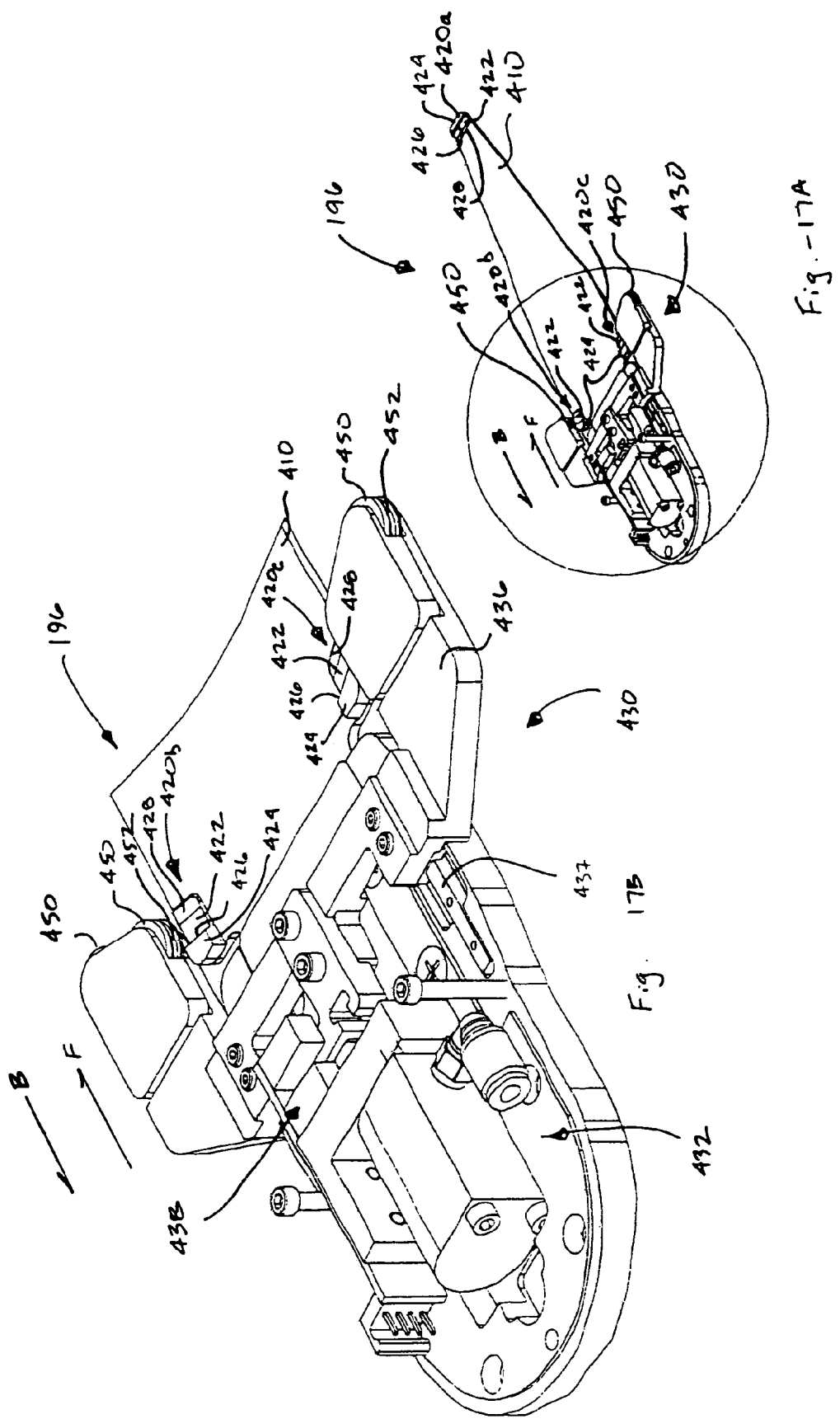

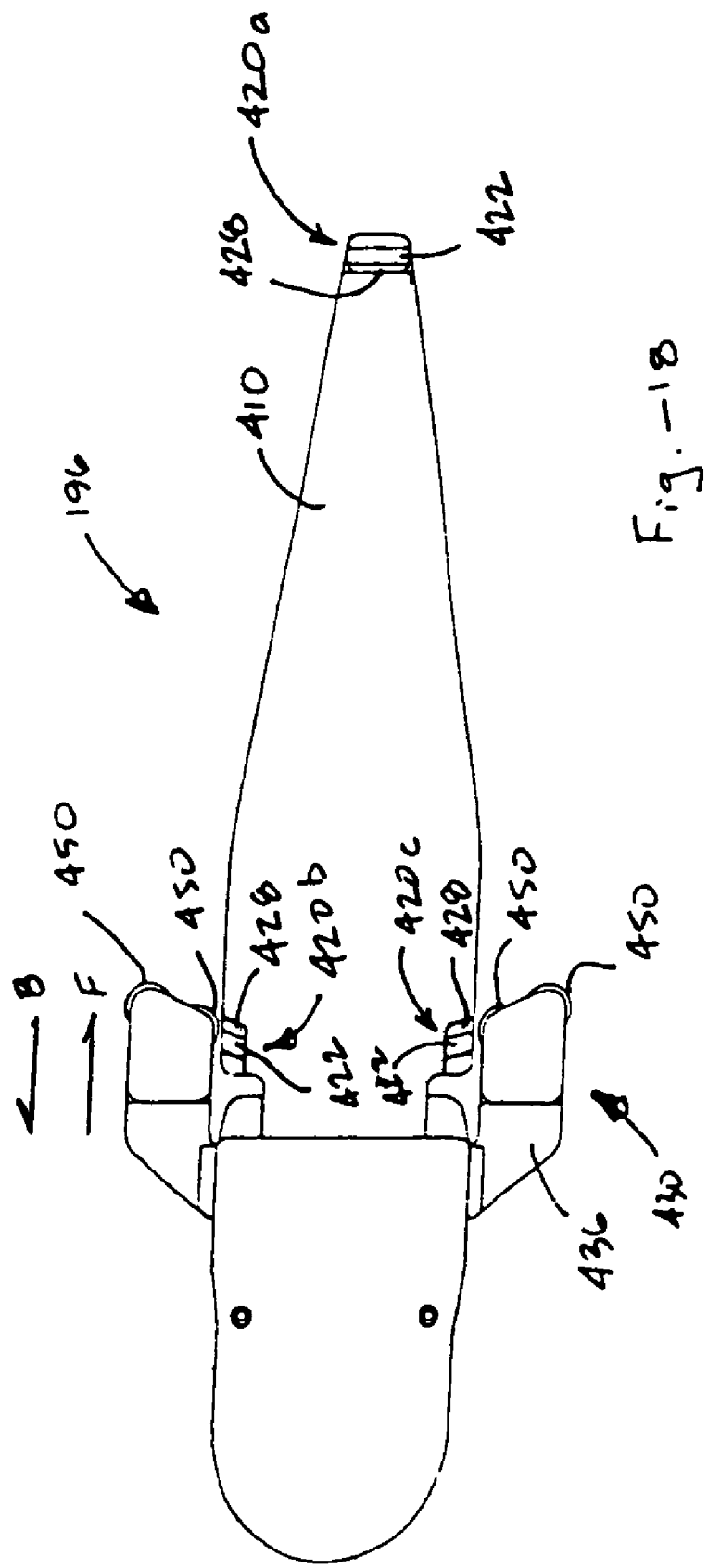

INTEGRATED TOOL WITH INTERCHANGEABLE WET PROCESSING COMPONENTS FOR PROCESSING MICROFEATURE WORKPIECES AND AUTOMATED CALIBRATION SYSTEMS

CROSS-REFERENCE TO RELATED APPLICATIONS

The present application claims the benefit of U.S. Application Nos. 60/476,786 filed Jun. 6, 2003; 60/476,776 filed Jun. 6, 2003; and 60/501,566 filed Sep. 9, 2003, all of which are incorporated herein in their entirety, including appendices, by reference.

TECHNICAL FIELD

The present invention is directed toward apparatus and methods for processing microfeature workpieces having a plurality of microdevices integrated in and/or on the workpieces. The microdevices can include submicron features. Particular aspects of the invention are directed toward a tool having a dimensionally stable deck with universal features for installing wet processing components. Additional aspects of the present invention are directed toward an automated calibration system for positioning a robotic transport system relative to a dimensionally stable mounting module.

BACKGROUND

Microdevices are manufactured by depositing and working several layers of materials on a single substrate to produce a large number of individual devices. For example, layers of photoresist, conductive materials, and dielectric materials are deposited, patterned, developed, etched, planarized, and otherwise manipulated to form features in and/or on a substrate. The features are arranged to form integrated circuits, micro-fluidic systems, and other structures.

Wet chemical processes are commonly used to form features on microfeature workpieces. Wet chemical processes are generally performed in wet chemical processing tools that have a plurality of individual processing chambers for cleaning, etching, electrochemically depositing materials, or performing combinations of these processes. FIG. 1 schematically illustrates an integrated tool 10 that can perform one or more wet chemical processes. The tool 10 includes a housing or cabinet 20 having a platform 22, a plurality of wet chemical processing chambers 30 in the cabinet 20, and a transport system 40. The tool 10 also includes lift-rotate units 32 coupled to each processing chamber 30 for loading/unloading the workpieces W. The processing chambers 30 can be rinse/dry chambers, cleaning capsules, etching capsules, electrochemical deposition chambers, or other types of wet chemical processing vessels. The transport system 40 includes a linear track 42 and a robot 44 that moves along the track 42 to transport individual workpieces W within the tool 10. The integrated tool 10 further includes a workpiece storage unit 60 having a plurality of containers 62 for holding workpieces W. In operation, the robot 44 transports workpieces to/from the containers 62 and the processing chambers 30 according to a predetermined workflow within the tool 10.

Automated handling of workpieces is an important aspect in the performance of semiconductor processing tools. As shown in FIG. 1, the robot 44 must accurately transfer and position workpieces at six different processing chambers 30 and two containers 62. The robot 44 moves the workpieces W among the processing chambers 30 and the containers 62 by moving along the track 42, rotating about several pivot points, and raising/lowering the workpiece W in a variety of complex motions.

One challenge of automated handling of workpieces is to properly calibrate the various components of the transport system 40 to move accurately to/from the processing chambers 30 and the containers 62. The transport system 40 is calibrated by "teaching" the robot 44 the specific positions of the chambers 30 and containers 62. Conventional processes for teaching the robot 44 usually involve manually positioning the robot 44 at a desired location with respect to each chamber 30 and each container 62. The encoder value corresponding to the position of the robot at each of these components is recorded and inputted as a program value. In addition to teaching the robot specific locations within the tool, the arms and end-effectors of the robot must be aligned with the reference frame in which the program values for the processing chambers 30 and the containers 62 were recorded. Although manually aligning the components of the robot to the reference frame and manually teaching the robot the location of each processing chamber 30 and container 62 is an accepted process for setting up the transport system 40, it is also extremely time consuming and subject to operator error. For example, it takes approximately 6–8 hours to align the components of a dual end-effector robot to the reference frame and to teach the robot the locations of ten chambers and two containers. Moreover, the quality of each inputted value is subject to operator error because it is often difficult to accurately position the robot in one or more of the chambers 30 or containers 62.

Another challenge of operating integrated wet chemical processing tools is repairing and/or maintaining the processing chambers. In electrochemical deposition chambers, for example, consumable electrodes degrade over time because the reaction between the electrodes and the electrolytic solution decomposes the electrodes. The shape of consumable electrodes accordingly changes causing variations in the electrical field. As a result, consumable electrodes must be replaced periodically to maintain the desired deposition parameters across the workpiece. The electrical contacts that contact the workpiece also may need to be cleaned or replaced periodically. To maintain or repair electrochemical deposition chambers, they are typically removed from the tool 10 and replaced with an extra chamber.

One problem with repairing or maintaining existing wet chemical processing chambers is that the tool must be taken offline for an extended period of time to remove and replace the processing chambers 30 from the tool 10. When the processing chamber 30 is removed from the tool 10, a pre-maintained processing chamber 30 is mounted to the platform 22 at the vacant station, and then the lift-rotate unit 32 is recalibrated to operate with the new processing chamber. The robot 44 is then re-taught to operate with the new position of the lift-rotate unit 32. This is a time-consuming process that increases the downtime for repairing or maintaining processing chambers for the reasons explained above. As a result, when only one processing chamber 30 of the tool 10 does not meet specifications, it is often more efficient to continue operating the tool 10 without stopping to repair the one processing chamber 30 until more processing chambers do not meet the performance specifications. The loss of throughput of a single processing chamber 30, therefore, is not as severe as the loss of throughput caused by taking the tool 10 offline to repair or maintain a single one of the processing chambers 30.

The practice of operating the tool 10 until at least two processing chambers 30 do not meet specifications severely impacts the throughput of the tool 10. For example, if the tool 10 is not repaired or maintained until at least two or three processing chambers 30 are out of specification, then the tool operates at only a fraction of its full capacity for a period of time before it is taken offline for maintenance. This increases the operating costs of the tool 10 because the throughput not only suffers while the tool 10 is offline to replace the wet processing chambers 30 and reteach the robot 44, but the throughput is also reduced while the tool is online because it operates at only a fraction of its full capacity. Moreover, as the feature sizes decrease, the electrochemical deposition chambers 30 must consistently meet much higher performance specifications. This causes the processing chambers 30 to fall out of specifications sooner, which results in shutting down the tool more frequently. Therefore, the downtime associated with calibrating the transport system and repairing/maintaining electrochemical deposition chambers is significantly increasing the cost of operating wet chemical processing tools.

SUMMARY

The present invention is directed toward an integrated tool that enables wet chemical processing chambers, lift-rotate units and other hardware to be quickly interchanged without having to recalibrate the transport system or other components of the tool. This is expected to reduce the down time associated with repairing or maintaining processing chambers and/or lift-rotate units so that the tool can remain online for a larger percentage of available operating time. Moreover, reducing the downtime for maintenance makes it more economical to repair each chamber as needed instead of waiting for two or more chambers to fall out of specifications. Several aspects of the invention are particularly useful for applications that have stringent performance requirements because the processing chambers are likely to require maintenance more frequently, and reducing the down time associated with frequently maintaining such components will significantly enhance the throughput of the integrated tool.

One embodiment of an integrated tool for wet chemical processing of microfeature workpieces includes a mounting module, a wet chemical processing chamber carried by the mounting module, and a transport system carried by the mounting module. The mounting module includes a plurality of positioning elements and attachment elements. In one embodiment, the mounting module is configured to maintain relative positions between the positioning elements to within a range that does not require the transport system to be recalibrated when the processing chamber is replaced for repair or maintenance. The mounting module, for example, can include a deck having a rigid outer panel, a rigid interior panel juxtaposed to the outer panel, and joists or other types of bracing between the outer and interior panels. The outer panel, the bracing and the interior panel are fastened together to create a structure that does not deflect, warp or otherwise change its dimension to maintain the relative positions between the positioning elements on the deck.

The wet chemical processing chamber has a first interface member engaged with one of the positioning elements and a first fastener engaged with one of the attachment elements. Similarly, the transport system has a second interface member engaged with one of the positioning elements and a second fastener engaged with one of the attachment elements. By engaging the interface members of the processing chamber and the transport system with positioning elements of the mounting module, the wet chemical processing chamber and the transport system are precisely located at known locations on the mounting module. Moreover, because the mounting module is dimensionally stable, the relative position between the wet chemical processing chamber and the transport system can be consistently maintained after replacing one wet chemical processing chamber with another. These two aspects of the tool enable the transport system to transport workpieces to/from the processing chambers without having to recalibrate the transport system each time a processing chamber is removed and replaced for maintenance.

The present invention is further directed toward a transport system with a calibration system for quickly aligning a robot of the transport system to the mounting module. Because the processing chambers, the transport system, and any other stations are attached to the mounting module at precise locations in a reference frame, the robot can interface with the processing chambers or other stations by aligning the robot with the reference frame without specifically teaching the robot the location of each chamber. In one embodiment, for example, the robot does not need to be taught the specific location of each station or cassette by moving the robot to the desired wafer locations and inputting the encoder values for each position. It is expected that several embodiments of the automated calibration system will align the robot with the reference frame and the processing chambers in a period of less than 45 minutes. In other embodiments, the automated calibration system is expected to do this in less than 15 minutes, or even less than five minutes. For example, one embodiment of the automated calibration system can position the robot to operate with ten processing chambers and two containers within approximately 8–10 minutes. As such, the calibration system is expected to reduce downtime for maintenance and repair by several hours.

The present invention is also directed toward interchangeable workpiece handling devices and associated tools for processing microfeature workpieces. The workpiece handling device can be a lift-rotate unit or just a lift-unit that supports a workpiece, such as a wafer, at a processing station to undergo electrochemical deposition, cleaning, or other wet chemical processes. By making the workpiece handling devices interchangeable, they can be easily and quickly replaced to reduce downtime for maintaining or repairing the workpiece handling devices. Furthermore, in some embodiments, the workpiece handling devices need not be calibrated after installation.

In one embodiment, an apparatus for handling microfeature workpieces includes a device support having a first alignment surface at an alignment plane, a chamber aperture, a processing chamber received in the chamber aperture, and a workpiece handling device. The device support can be the deck of the mounting module, and the first alignment surface can be an upper surface of the deck. The workpiece handling device includes a workpiece support positioned to carry the workpiece at a processing position of the chamber, a drive unit operatively coupled to the workpiece support to translate the workpiece along a generally linear motion axis, and a mounting portion coupled to the workpiece support. The mounting support has a second alignment surface removably mated with the first alignment surface. The workpiece handling device is supported relative to the device support only at or above the alignment plane (e.g., the deck). As a result, the workpiece handling device can be easily removed and replaced, and need not interfere with access to components of the apparatus located beneath the alignment plane.

In other embodiments, the drive unit is coupled to the microfeature workpiece support at an interface with a driven portion of the support, and moves the interface from a first end position to a second end position. A mounting surface of the handling device can be positioned in an alignment plane that does not intersect the translation axis between the first and second end positions.

Methods in accordance with other embodiments of the invention can reduce the time required to replace the workpiece handling devices. For example, in one embodiment, a first workpiece handling device having a first workpiece support and a first drive unit to translate the support along a first translation axis is removed from a workpiece processing tool and replaced with a second workpiece handling device. The second workpiece handling device includes a second workpiece support and a second drive unit. The method further includes moving microfeature workpieces to and from the second workpiece handling device without calibrating the second workpiece handling device after replacing the first workpiece handling device.

A method in accordance with another embodiment of the invention includes disconnecting both electrical and fluid communication to a first workpiece handling device by moving at least one of a first connector assembly coupled to the tool and a second connector assembly coupled to the first workpiece handling device relative to the other along a single axis in a first direction. The method further includes connecting both electrical and fluid communication to a second workpiece handling device by moving at least one of the first connector assembly and a third connector assembly coupled to the second workpiece handling device relative to the other along the single axis in a second direction opposite the first direction. Accordingly, the electrical and fluid communication links between the tool and the workpiece handling device are easily disconnected and reconnected when replacing one handling device with another.

BRIEF DESCRIPTION OF THE DRAWINGS

FIG. 12 is a flow chart of a method for automatically calibrating a robot of a transport system to a reference frame in accordance with an embodiment of the invention.

FIGS. 14A and 14B are top plan views illustrating other stages for calibrating a robot of a transport system in accordance with another embodiment of the invention.

FIGS. 16A and 16B are top plan views illustrating other stages of a method for calibrating a robot of a transport system in accordance with an embodiment of the invention.

FIGS. 17A and 17B are isometric views illustrating an end-effector for use with a transport system in accordance with an embodiment of the invention.

FIG. 18 is a top plan view of the end-effector shown in FIGS. 17A and 17B.

DETAILED DESCRIPTION

As used herein, the terms "microfeature workpiece" or "workpiece" refer to substrates on and/or in which microelectronic devices are formed. Typical microdevices include microelectronic circuits or components, thin-film recording heads, data storage elements, microfluidic devices, and other products. Micromachines or micromechanical devices are included within this definition because they are manufactured in much the same manner as integrated circuits. The substrates can be semiconductive pieces (e.g., doped silicon wafers or gallium arsenide wafers), nonconductive pieces (e.g., various ceramic substrates), or conductive pieces.

Several embodiments of integrated tools for wet chemical processing of microfeature workpieces are described in the context of depositing metals or electrophoretic resist in or on structures of a workpiece. The integrated tools in accordance with the invention, however, can also be used in etching, rinsing or other types of wet chemical processes in the fabrication of microfeatures in and/or on semiconductor substrates or other types of workpieces. Several embodiments of tools in accordance with the invention are set forth in FIGS. 2A–26 and the following text provide a thorough understanding of particular embodiments of the invention. The description is divided into the following sections: (A) Embodiments of Integrated Tools With Mounting Modules; (B) Embodiments of Dimensionally Stable Mounting Modules; (C) Embodiments of Wet Chemical Processing Chambers; (D) General Embodiments of Workpiece Handling Apparatus and Load/Unload Modules; (E) System and Methods for Automated Robot Calibration; (F) Embodiments of End-Effectors; and (G) Additional Embodiments of Workpiece Handling Apparatus. A person skilled in the art will understand, however, that the invention may have additional embodiments, or that the invention may be practiced without several of the details shown in FIGS. 2A–26.

A. Embodiments of Integrated Tools With Mounting Modules

Figure 1:
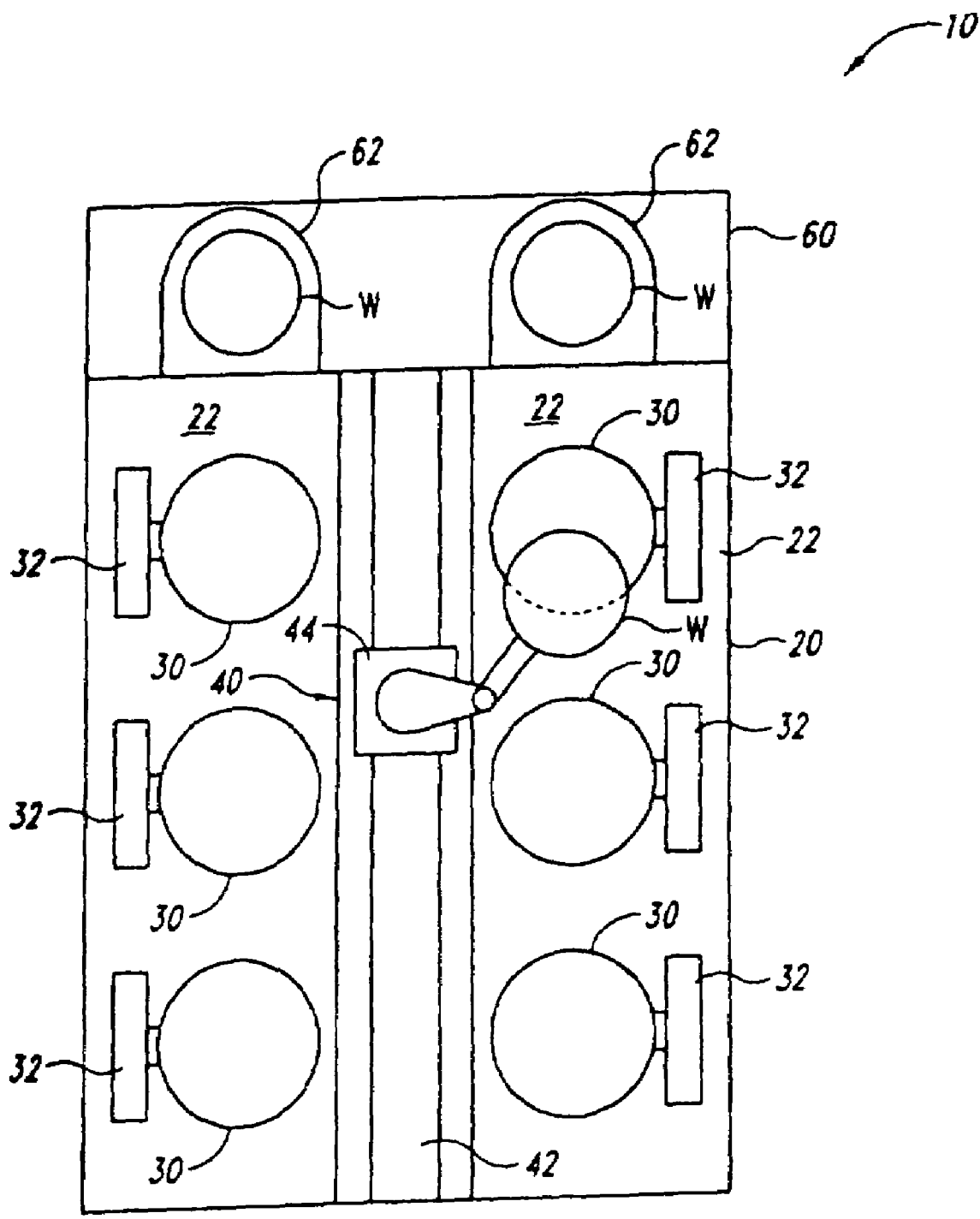
FIG. 1 is a schematic top plan view of a wet chemical processing tool in accordance with the prior art.
Figure 2A:
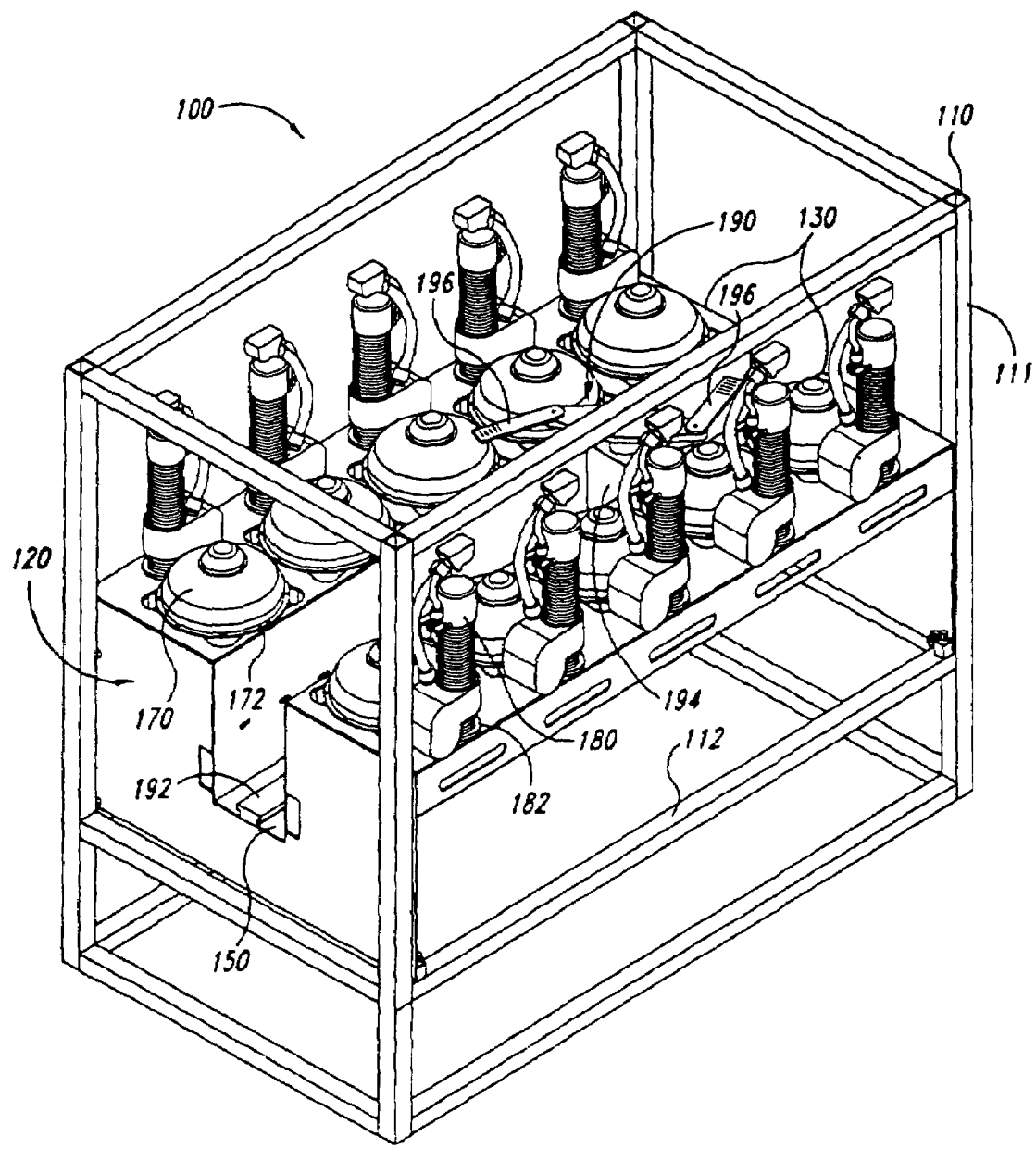
FIG. 2A is an isometric view illustrating a portion of a wet chemical processing tool in accordance with one embodiment of the invention.

FIG. 2A is an isometric view showing a portion of an integrated tool 100 in accordance with an embodiment of the invention. In this embodiment, the integrated tool 100 includes a frame 110, a dimensionally stable mounting module 120 mounted to the frame 110, a plurality of wet chemical processing chambers 170, and a plurality of lift-rotate units 180. The tool 100 can also include a transport system 190. The mounting module 120 carries the processing chambers 170, the lift-rotate units 180, and the transport system 190.

The frame 110 has a plurality of posts 111 and cross-bars 112 welded together in a manner known in the art. A plurality of outer panels and doors (not shown in FIG. 2A) are generally attached to the frame 110 to form an enclosed cabinet. The mounting module 120 in the illustrated embodiment is at least partially housed within the frame 110 and carried by the cross-bars 112 of the frame 110. In other embodiments the mounting module 120 stands directly on the floor of the facility or other structure without being supported by the frame 110.

The mounting module 120 is a rigid, stable structure that maintains the relative positions between the wet chemical processing chambers 170, the lift-rotate units 180, and the transport system 190. One aspect of the mounting module 120 is that it is much more rigid and has a significantly greater structural integrity compared to the frame 110 so that the relative positions between the wet chemical processing chambers 170, the lift-rotate units 180, and the transport system 190 do not change over time. Another aspect of the mounting module 120 is that it includes a dimensionally stable deck 130 with positioning elements at precise locations for positioning the processing chambers 130 and the lift-rotate units 180 at known locations on the deck 130. In one embodiment (not shown), the transport system 190 can be mounted directly to the deck 130. In other embodiments, the mounting module 120 also has a dimensionally stable platform 150 and the transport system 190 is mounted to the platform 150. The deck 130 and the platform 150 are fixedly positioned relative to each other so that positioning elements on the deck 130 and positioning elements on the platform 150 do not move relative to each other. The mounting module 120 accordingly provides a system in which wet chemical processing chambers 170 and lift-rotate units 180 can be removed and replaced with interchangeable components in a manner that accurately positions the replacement components at precise locations on the deck 130.

The tool 100 is particularly suitable for applications that have demanding specifications which require frequent maintenance of the wet chemical processing chambers 170, the lift-rotate units 180, or the transport system 190. A wet chemical processing chamber 170 can be repaired or maintained by simply detaching the chamber from the processing deck 130 and replacing the chamber 170 with an interchangeable chamber having mounting hardware configured to interface with the positioning elements on the deck 130. Because the mounting module 120 is dimensionally stable and the mounting hardware of the replacement processing chamber 170 interfaces with the deck 130, the chambers 170 can be interchanged on the deck 130 without having to recalibrate the transport system 190. This is expected to significantly reduce the downtime associated with repairing or maintaining processing chambers 170 so that the tool can maintain a high throughput in applications that have stringent performance specifications.

Figure 2B:
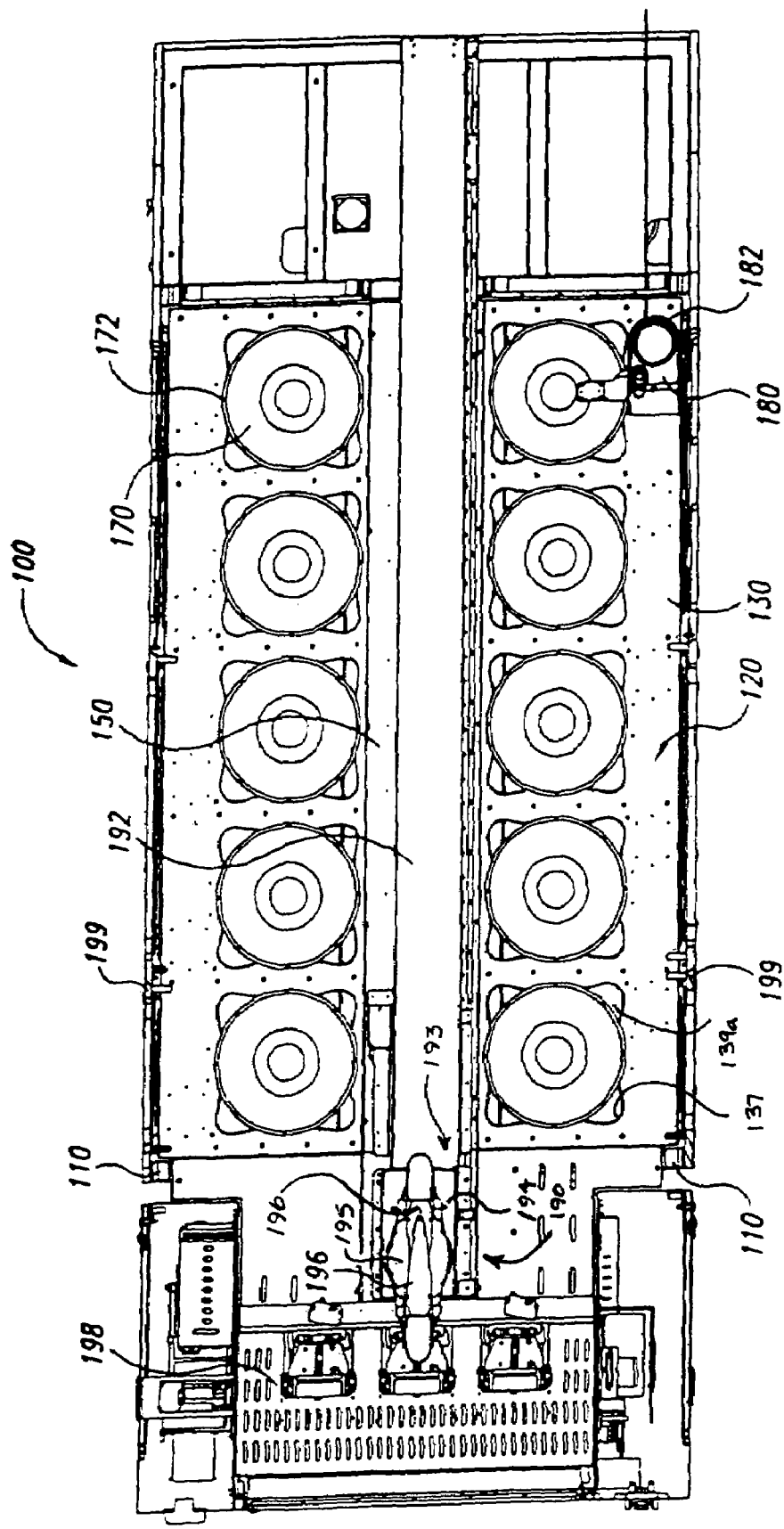
FIG. 2B is a top plan view of a wet chemical processing tool in accordance with an embodiment of the invention.

FIG. 2B is a top plan view of the tool 100 illustrating the transport system 190 and a load/unload module 198 attached to the mounting module 120. Referring to FIGS. 2A and 2B together, the transport system 190 includes a track 192 and a robot 193 (FIG. 2B). The track 192 is mounted to the platform 150 in the embodiment shown in FIGS. 2A and 2B. More specifically, the track 192 interfaces with positioning elements on the platform 150 to accurately position the track 192 relative to the chambers 170 and the lift-rotate units 180 attached to the deck 130. The robot 193 can include a base unit 194 that moves linearly along the track 192, an arm assembly 195 carried by the base unit 194, and end-effectors 196 rotatably carried by the arm assembly 195. The arm assembly 195 rotates and moves along an elevation axis to position the end-effectors 196 at the chambers 170 and cassettes in the load/unload module 198. The robot 193 and end-effectors 196 can accordingly move in a fixed, dimensionally stable reference frame established by the mounting module 120. Referring to FIG. 2B, the tool 100 can further include a plurality of panels 199 attached to the frame 110 to enclose the mounting module 120, the wet chemical processing chambers 170, the lift-rotate units 180, and the transport system 190 in a cabinet. In other embodiments, the panels 199 on one or both sides of the tool 100 can be removed in the region above the processing deck 130 to provide an open tool.

B. Embodiments of Dimensionally Stable Mounting Modules

Figure 3:
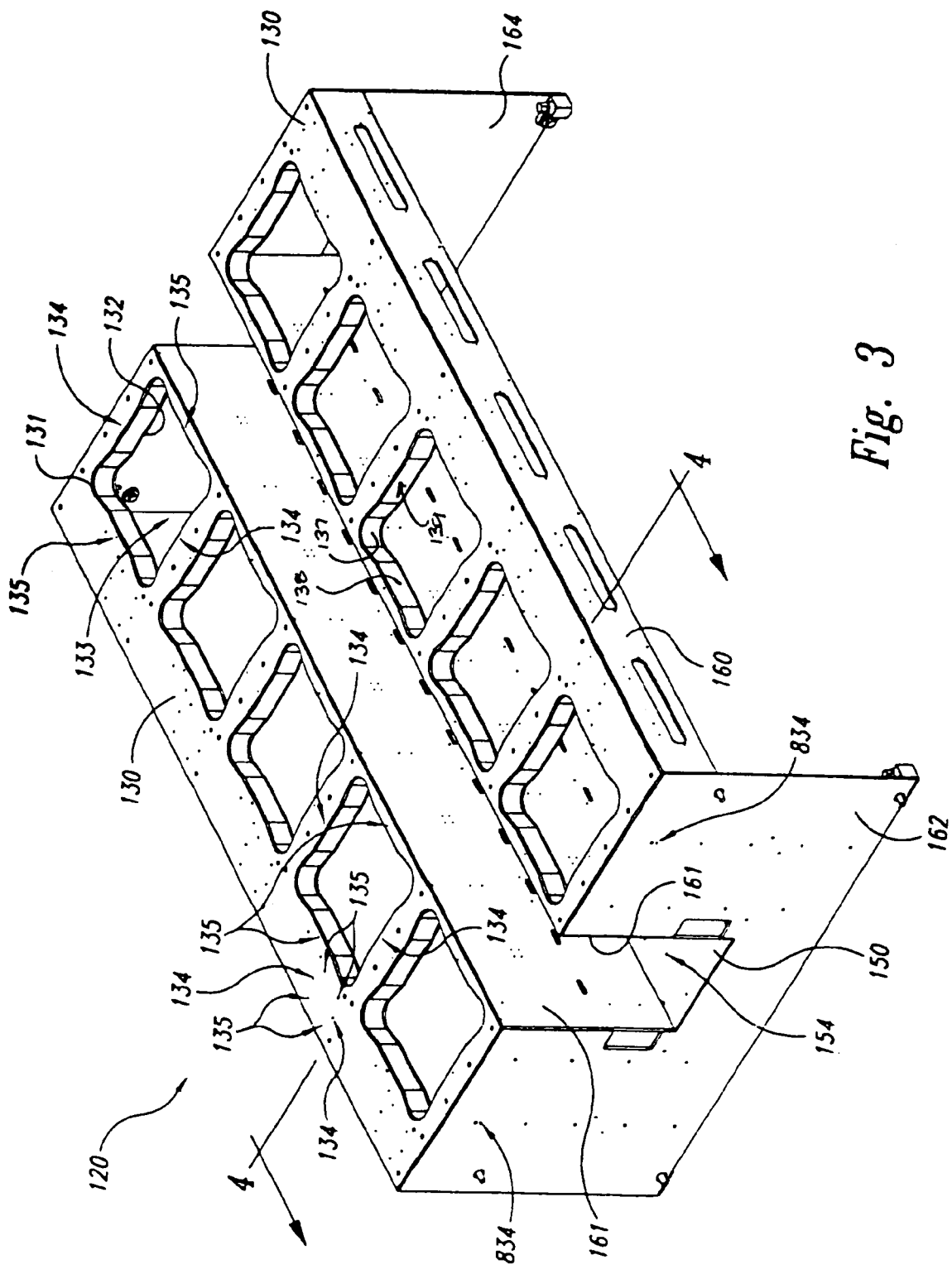
FIG. 3 is an isometric view of a mounting module for use in a wet chemical processing tool in accordance with an embodiment of the invention.

FIG. 3 is an isometric view of a mounting module 120 in accordance with an embodiment of the invention for use in the tool 100. In this embodiment, the deck 130 includes a rigid first panel 131 and a rigid second panel 132 superimposed underneath the first panel 131. The first panel 131 can be an outer member and the second panel 132 can be an interior member juxtaposed to the outer member. The first and second panels 131 and 132 can also have different configurations than the embodiment shown in FIG. 3. A plurality of chamber receptacles 133 are disposed in the first and second panels 131 and 132 to receive the wet chemical processing chambers 170 (FIG. 2A).

The deck 130 can further include a plurality of positioning elements 134 and attachment elements 135 arranged in a precise pattern across the first panel 131. The positioning elements 134 can be holes machined in the first panel 131 at precise locations and/or dowels or pins received in the holes. The dowels are also configured to interface with the wet chemical processing chambers 170 (FIG. 2A). In other embodiments, the positioning elements 134 can be pins, such as cylindrical pins or conical pins, that project upwardly from the first panel 131 without being positioned in holes in the first panel 131. The deck 130 has a first set of positioning elements 134 located at each chamber receptacle 133 to accurately position the individual wet chemical processing chambers at precise locations on the mounting module 120. The deck 130 can also include a second set of positioning elements 134 near each receptacle 133 to accurately position individual lift-rotate units 180 at precise locations on the mounting module 120. The attachment elements 135 can be threaded holes in the first panel 131 that receive bolts to secure the chambers 170 and the lift-rotate units 180 to the deck 130.

The chamber receptacles 133 can be configured along with the positioning elements 134 and the attachment elements 135 to provide a universal aperture that can receive different sizes and shapes of chambers. In the embodiment shown in FIG. 3, for example, the receptacles can have a generally rectilinear shape with bulges 137 in the corners and contact regions 138 along the sides between the corners. The bulges 137 can be curved or have squared corners, and the contact regions 138 can be linear or slightly curved. The receptacles 133 can further include an inner wall 139. The chamber receptacles 133 can accordingly accommodate cylindrical chambers having a diameter that fits within the contact regions and/or rectilinear chambers having a length and width that fits within the contact regions. The positioning elements 134 and the attachment elements 135 can further have a universal arrangement such that different types of chambers can have a mounting element with a corresponding arrangement of interface elements and fasteners to engage the universal arrangement of positioning elements 134 and attachment elements 135, respectively. For example, the positioning elements 134 and attachment elements 135 can generally be located in a universal pattern proximate to the contact regions 138 so that the chambers 170 need only to fit within the receptacles 133 and the mounting element need only to have corresponding interface elements and fasteners that engage the position elements 134 and attachment elements 135. As a result, a tool manufacturer can produce a single deck configuration for many different types of tools. This allows tool manufacturers and/or device fabricators to configure and/or reconfigure a tool with the desired types of processing chambers without having to have a dedicated platform or deck. This is expected to significantly reduce the cost of manufacturing and operating wet chemical processing tools.

Another feature of the receptacles 133 is that conduits can pass through the bulges 137 between the area above the deck 130 and the area below the deck 130. Referring to FIG. 2B, for example, several openings 139a through the deck 130 are defined by the bulges 137 and the outer walls of the chambers 170. As such, fluid and electrical lines can be routed through the openings 139a to easily accommodate different types of chambers using a single configuration of the deck 130. This allows tool manufacturers to cost effectively make a number of common mounting modules with identical decks, and then install any number of different combinations of different chambers according to a customer's specific requirement. For example, in the customer wants a tool with both electrochemical deposition chambers and wet cleaning capsules, conventional systems would require that a deck be specifically designed and manufactured to have fluid lines passing up through the deck to the wet cleaning capsules at the locations of the cleaning capsules. The deck 130 shown in FIGS. 2B and 3 alleviates having to design and manufacture such customized decks for each application because the fluid lines and electrical lines can be routed through the openings 139a irrespective of where the wet cleaning capsules and electrochemical deposition chambers are mounted to the deck 130. As a result, tool manufacturers can mass produce the decks 130 at a lower unit cost and still provide tools with custom configurations.

Another feature of the receptacles 133 is that the openings 139a allow gases to flow through the deck 130 for enhanced venting of the tool. In many applications, air is introduced in the area above the deck 130 and exhausted out from the areas under the deck 130. This is to remove vapors that can collect in both the areas above and below the deck 130. The openings 139a allow the clean air and vapors above the deck 130 to flow through the deck 130 and into the compartment below the deck 130. The air below the deck is then drawn out from the tool. Additionally, the inner wall 139 around the receptacles 133 prevents vapors in the air or liquids from the chambers from collecting in the interstitial spaces of the deck 130 between the first panel 131 and the second panel 132.

The mounting module 120 also includes exterior side plates 160 along longitudinal outer edges of the deck 130, interior side plates 161 along longitudinal inner edges of the deck 130, and endplates 162 and 164 attached to the ends of the deck 130. The transport platform 150 is attached to the interior side plates 161 and the end plates 162 and 164. The transport platform 150 includes positioning elements 152 for accurately positioning the track 192 (FIGS. 2A and 2B) of the transport system 190 on the mounting module 120. The transport platform 150 can further include attachment elements, such as tapped holes, that receive bolts to secure the track 192 to the platform 150.

Figure 4:
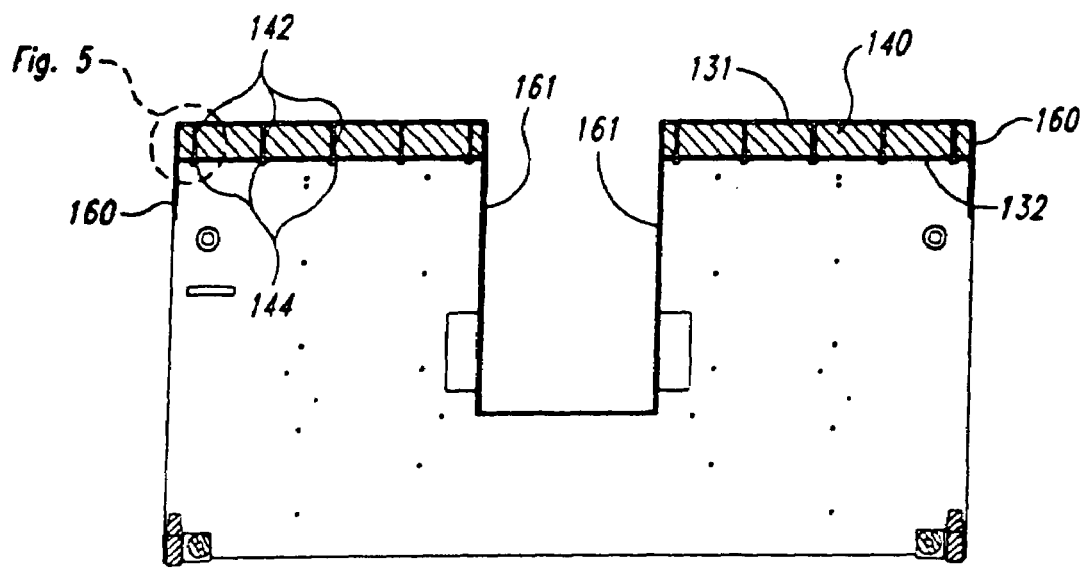
FIG. 4 is a cross-sectional view along line 4—4 of FIG. 3 of a mounting module for use in a wet chemical processing tool in accordance with an embodiment of the invention.
Figure 5:
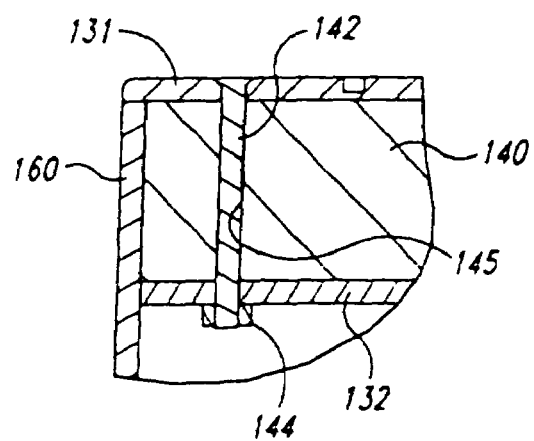
FIG. 5 is a cross-sectional view showing a portion of a deck of a mounting module in greater detail.

FIG. 4 is a cross-sectional view illustrating one suitable embodiment of the internal structure of the deck 130, and FIG. 5 is a detailed view of a portion of the deck shown in FIG. 4. In this embodiment, the deck 130 includes bracing 140, such as joists, extending laterally between the exterior side plates 160 and the interior side plates 161. The first panel 131 is attached to the upper side of the bracing 140, and the second panel 132 is attached to the lower side of the bracing 140. The deck 130 can further include a plurality of throughbolts 142 and nuts 144 that secure the first and second panels 131 and 132 to the bracing 140. As best shown in FIG. 5, the bracing 140 has a plurality of holes 145 through which the throughbolts 142 extend. The nuts 144 can be welded to the bolts 142 to enhance the connection between these components.

The panels and bracing of the deck 130 can be made from stainless steel, other metal alloys, solid cast materials, or fiber-reinforced composites. For example, the panels and plates can be made from Nitronic 50 stainless steel, Hastelloy 625 steel alloys, or a solid cast epoxy filled with mica. The fiber-reinforced composites can include a carbon-fiber or Kevlar® mesh in a hardened resin. The material for the panels 131 and 132 should be highly rigid and compatible with the chemicals used in the wet chemical processes. Stainless steel is well-suited for many applications because it is strong but not affected by many of the electrolytic solutions or cleaning solutions used in wet chemical processes. In one embodiment, the panels and plates 131, 132, 160, 161, 162 and 164 are 0.125 to 0.375 inch thick stainless steel, and more specifically they can be 0.250 inch thick stainless steel. The panels and plates, however, can have different thickness in other embodiments.

The bracing 140 can also be stainless steel, fiber-reinforced composite materials, other metal alloys, and/or solid cast materials. In one embodiment, the bracing can be 0.5 to 2.0 inch wide stainless steel joists, and more specifically 1.0 inch wide by 2.0 inches tall stainless steel joists. In other embodiments the bracing 140 can be a honey-comb core or other structures made from metal (e.g., stainless steel, aluminum, titanium, etc.), polymers, fiber glass or other materials.

The mounting module 120 is constructed by assembling the sections of the deck 130, and then welding or otherwise adhering the end plates 162 and 164 to the sections of the deck 130. The components of the deck 130 are generally secured together by the throughbolts 142 without welds. The outer side plates 160 and the interior side plates 161 are attached to the deck 130 and the end plates 162 and 164 using welds and/or fasteners. The platform 150 is then securely attached to the end plates 162 and 164, and the interior side plates 161. The order in which the mounting module 120 is assembled can have several different embodiments and is not limited to the procedure explained above.

The mounting module 120 provides a heavy-duty, dimensionally stable structure that maintains the relative positions between the positioning elements 134 on the deck 130 and the positioning elements 152 on the platform 150 within a range that does not require the transport system 190 to be recalibrated each time a replacement processing chamber 170 or lift-rotate unit 180 is mounted to the deck 130. The mounting module 120 is generally a rigid structure that is sufficiently strong to maintain the relative positions between the positioning elements 134 and 152 when the wet chemical processing chambers 170, the lift-rotate units 180, and the transport system 190 are mounted to the mounting module 120. In several embodiments, the mounting module 120 is configured to maintain the relative positions between the positioning elements 134 and 152 to within 0.025 inch. In other embodiments, the mounting module is configured to maintain the relative positions between the positioning elements 134 and 152 to within approximately 0.005 to 0.015 inch. As such, the deck 130 often maintains a uniformly flat surface to within approximately 0.025 inch, and in more specific embodiments to approximately 0.005–0.015 inch.

C. Embodiments of Wet Chemical Processing Chambers

Figure 6:
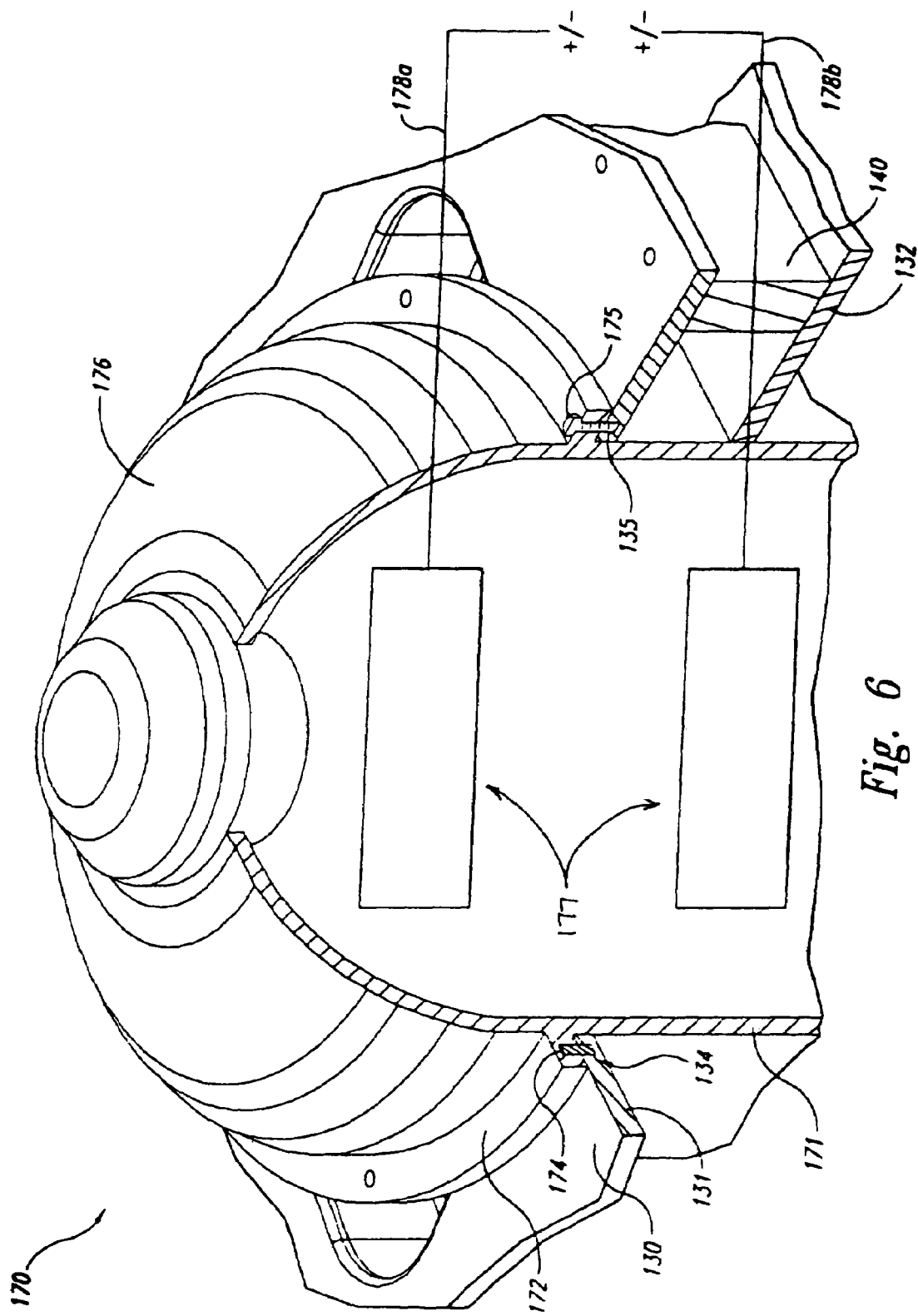
FIG. 6 is a cross-sectional isometric view schematically illustrating an electrochemical deposition chamber for use in the wet chemical processing tool in accordance with an embodiment of the invention.

FIG. 6 is an isometric cross-sectional view showing the interface between a wet chemical processing chamber 170 and the deck 130. The chamber 170 can include a processing vessel 171 and a collar 172. The processing vessel 171 can be formed from a polymeric material or other material compatible with the chemicals used in the wet chemical process. In many applications, the processing vessel 171 is composed of a high density polymer that does not react with the electrolytic solution, cleaning solution, or other type of fluid used in the chamber 170. The collar 172 and the vessel 171 can be separate components that are connected together. In such cases, the collar 172 can be made from a dimensionally stable material, such as stainless steel, fiber-reinforced materials, steel alloys, cast solid materials, or other suitably rigid materials. In other embodiments, the collar 172 is integral with the vessel 171 and formed from a high-density polymer or other suitable material.

The collar 172 includes a plurality of interface members 174 arranged in a pattern to be aligned with the positioning elements 134 on the deck 130. The positioning elements 134 and the interface members 174 are also configured to mate with one another to precisely position the collar 172, and thus the chamber 170, at a desired operating location on the deck 130 to work with the lift-rotate unit 180 and the transport system 190. The positioning elements 134 can be a set of precisely machined holes in the deck 130 and dowels received in the holes, and the interface members 174 can be holes precisely machined in the collar 172 to mate with the dowels. The dowels can be pins with cylindrical, spherical, conical or other suitable shapes to align and position the collar 172 at a precise location relative to the deck 130. The collar 172 can further include a plurality of fasteners 175 arranged to be aligned with the attachment elements 135 in the deck 130. The fasteners 175 can be bolts or other threaded members that securely engage the attachment elements 135 to secure the collar 172 to the deck 130. The collar 172 accordingly holds the processing vessel 171 at a fixed, precise location on the deck.

The wet chemical processing chambers 170 can be electrochemical deposition chambers, spin-rinse-dry chambers, cleaning capsules, etching chambers, or other suitable wet chemical processing stations. The chamber 170 illustrated in FIG. 6 is an electrochemical deposition chamber having a head 176 with a workpiece holder to position a workpiece in the vessel 171. The chamber 170 shown in FIG. 6 also has an electrical system 177 including a first electrode 178$a$ configured to contact the workpiece and a second electrode 178$b$ disposed in the vessel 171. The first and second electrodes 178$a$ and 178$b$ establish an electrical field to plate ions in an electrolytic solution onto the workpiece. It will be appreciated that the electrochemical processing chamber 170 can be an electroless chamber that does not include the electrical system 177. Suitable electrochemical deposition chambers are disclosed in (a) U.S. Pat. Nos. 6,569,297, and 6,660,137, and (b) U.S. Publication Nos. 2003/0068837; 2003/0079989; 2003/0057093; 2003/0070918; 2002/0032499; 2002/0139678; 2002/0125141; 2001/0032788; 2003/0127337; and 2004/0013808, all of which are herein incorporated by reference in their entirety. In other embodiments, the wet chemical processing chambers can be capsules or other types of chambers for cleaning wafers, such as those shown in U.S. Pat. Nos. 6,350,319; 6,423,642; and 6,413,436, all of which are also herein incorporated by reference in their entirety.

The tool 100 can include various combinations of wet chemical processing chambers 170. For example, all of the chambers can be of a common type (e.g., electrochemical deposition chambers, cleaning chambers, etching chambers, etc.), or various combinations of different types of chambers can be mounted to the deck 130 of the tool 100. Suitable combinations of wet chemical processing chambers 170 and workpiece transport systems 190 are disclosed in the references incorporated above and U.S. Publication Nos. 2001/0043856 and 2001/0102156, and U.S. patent application Ser. No. 09/875,428, all of which are herein incorporated by reference.

D. Embodiments of Lift Rotate Units and Load/Unload Modules

Figure 7:
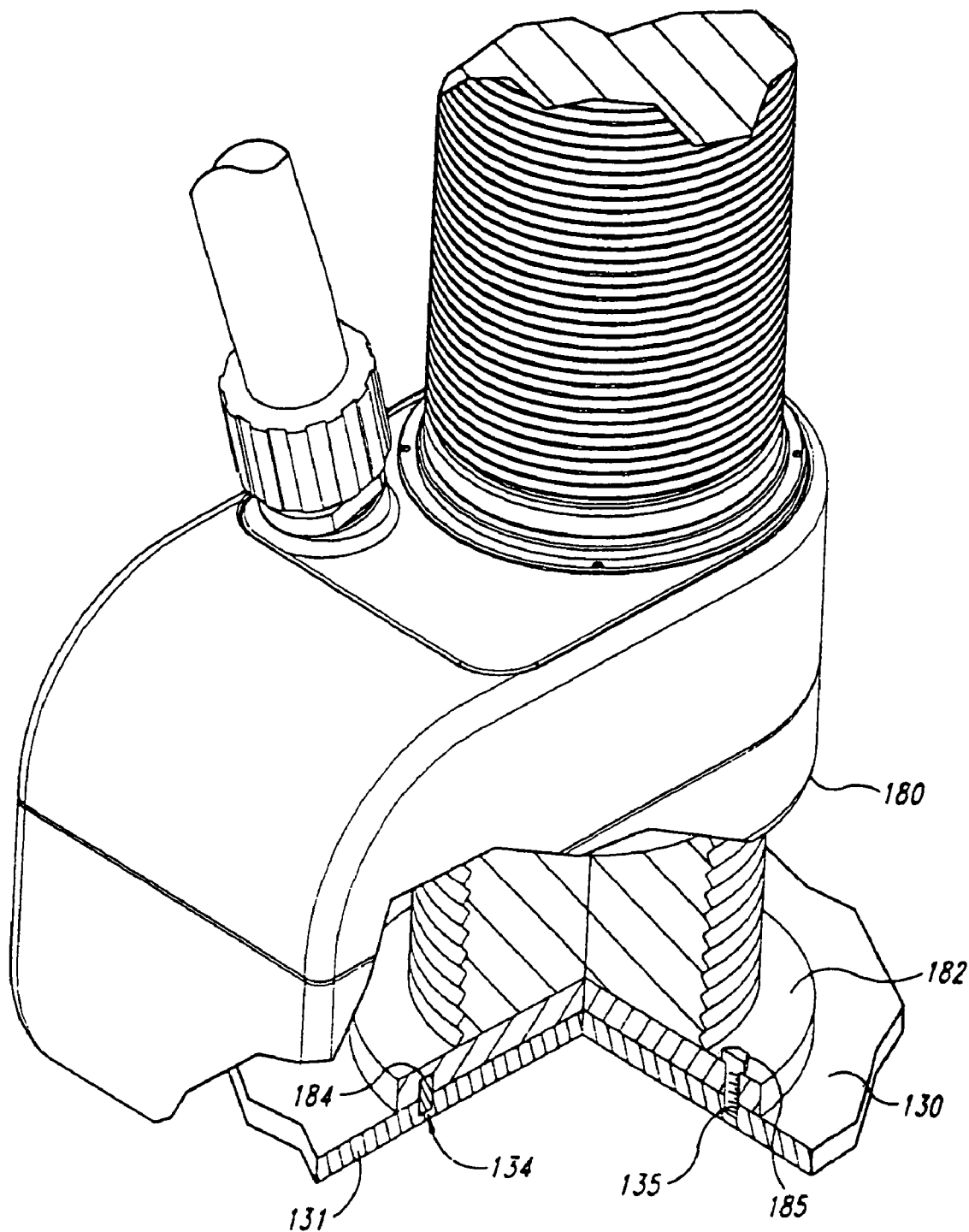
FIG. 7 is a cross-sectional isometric view of a lift-rotate unit for operating the head of wet chemical processing chambers in accordance with an embodiment of the invention.

FIG. 7 is an isometric cross-sectional view showing an embodiment of a lift-rotate unit 180 attached to the deck 130. In this embodiment, the lift-rotate unit 180 includes a dimensionally stable collar 182. The collar 182 includes a plurality of interface members 174 arranged in a pattern to be aligned with the positioning elements 134 when the lift-rotate unit 180 is positioned at the desired location for operating the head 176 of the chamber 170 (FIG. 6). The lift-rotate unit 180 can further include a plurality of fasteners 185 arranged in the collar 182 to be aligned with attachment elements 135 in the deck 130 for mounting the lift-rotate unit 180 to the mounting module 120. The interface elements 184, positioning elements 134, fasteners 185, and attachment elements 135 can have similar or identical structures as described above with reference to FIG. 6.

Figure 8:
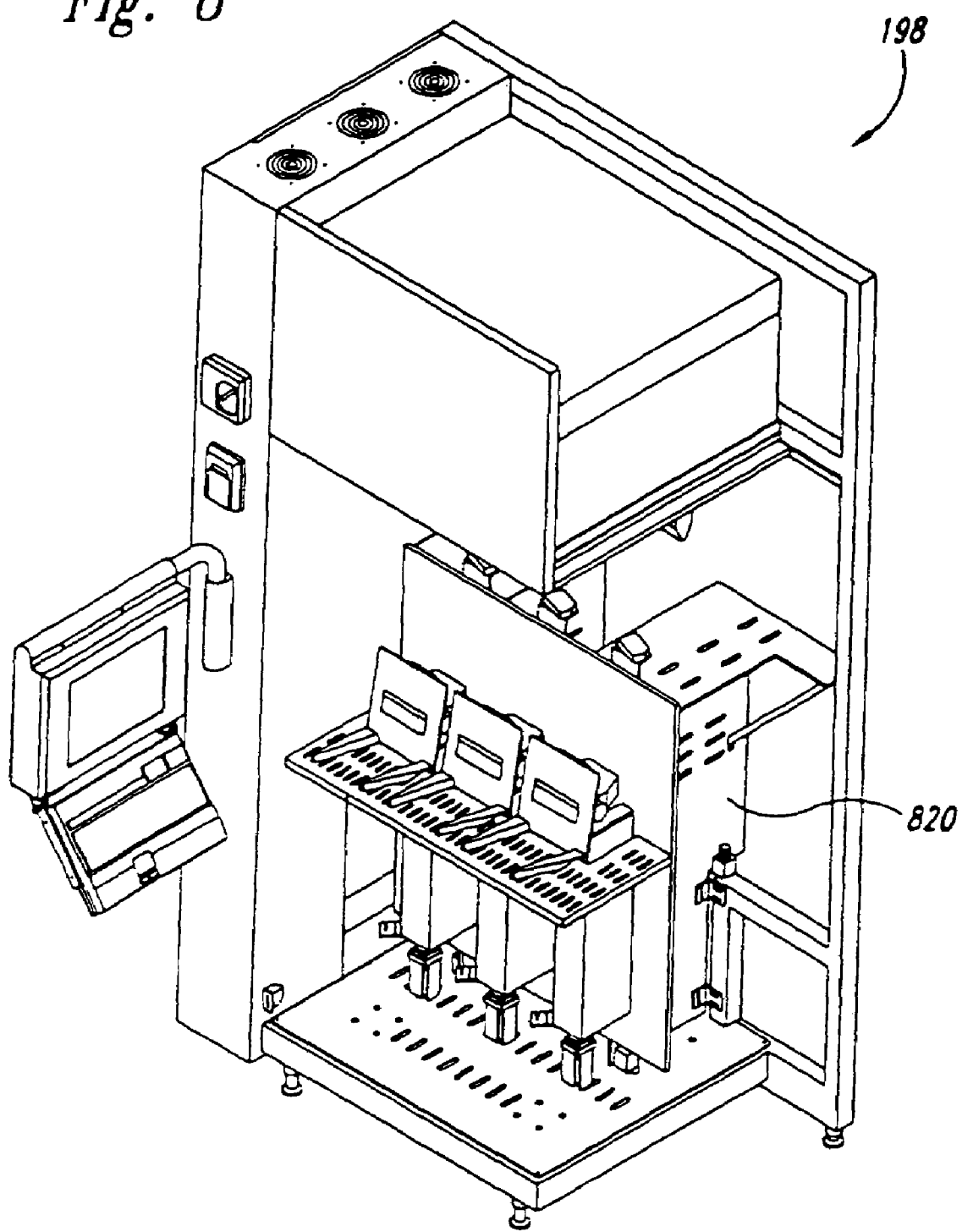
FIG. 8 is an isometric view of a loading/unloading module for use with the mounting module in accordance with an embodiment of the invention.

FIG. 8 is an isometric view of the load/unload module 198 for holding workpieces before and after being processed in the chambers 170. The load/unload module 198 has a dimensionally stable structure 820 that can be formed from stainless steel, other steel alloys, or other highly dimensionally stable materials in a manner similar to the mounting module 120 described above. Referring to FIGS. 3 and 8 together, the structure 820 can include interface members (not shown) arranged to be aligned with position elements 834 (FIG. 3) on the end plate 162 of the mounting module 120 when the load/unload module 198 is properly positioned for operation. The interface members on the structure 820 and the positioning elements 834 on the end plate 162 can be similar to those described above with reference to FIG. 6. The load/unload module 198 can accordingly be positioned accurately relative to the transport system 190 without having to recalibrate the transport system 190 each time the load/unload module 198 is attached to the tool 100.

The interface members on the structure 820 and the corresponding positioning elements 834 on the endplate 162 can be the same for different types of load/unload modules. As such, the load/unload module 198 can have different configurations of cassettes. This allows tool manufacturers and device fabricators to install different types of load/unload modules having different configurations of cassettes into tools without having to calibrate the transport systems to accommodate different types of work-in-progress cassettes or FOUPs.

E. Systems and Methods for Automated Robot Calibration

Figure 9:
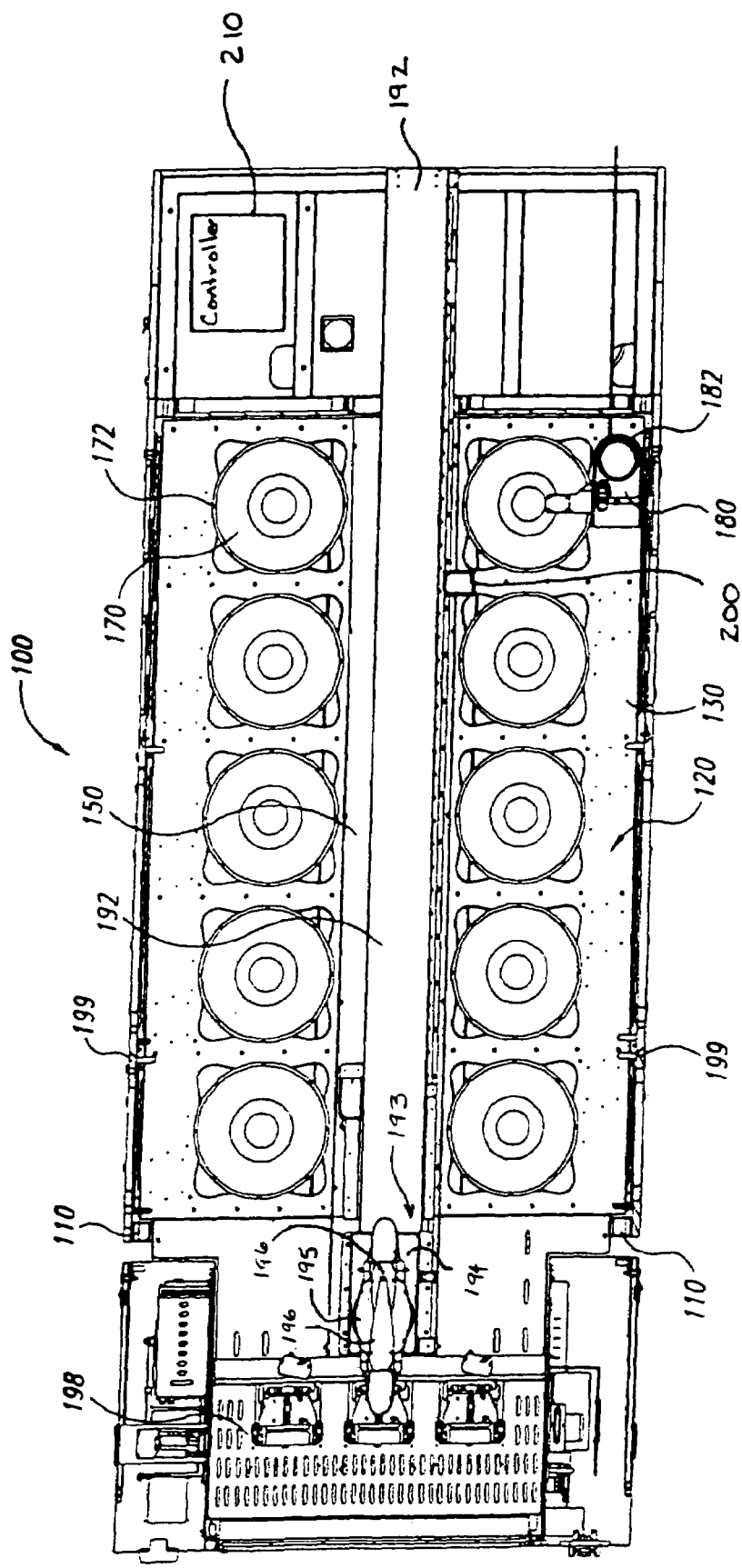
FIG. 9 is a top plan view of a wet chemical processing tool having an automated calibration system in accordance with an embodiment of the invention.

Another aspect of the present invention, as shown in FIG. 9, is directed toward systems and methods for automatically calibrating the transport system 190 to a reference frame of the tool 100. The calibration systems quickly position the arm unit 195 and the end-effectors 196 in a desired "zero" or origin position with respect to the axis of the track 192 or another axis of the reference frame. The calibration systems can also determine an axial origin position of the base 194 with respect to the track 192 and an elevation origin position of the arm assembly 195. Several embodiments of calibration systems in accordance with this aspect of the invention are particularly efficacious when used with the mounting module 120 because this combination of features enables methods that automatically calibrate/align the transport system 190 to operate with the processing chambers 170 without manually teaching the robot 193 the position of each chamber 170. As such, several methods in accordance with this aspect of the invention are expected to reduce the time to calibrate the transport system 190 to operate with the processing chambers 170 and the load/unload module 198 to only a few minutes instead of several hours.

The embodiment of the calibration system shown in FIG. 9 includes a sensor unit 200 (shown schematically) and a controller 210 (shown schematically). The sensor unit 200 is attached to the deck 130 or another portion of the mounting module 120 at a known location with respect to the reference frame of the tool 100. In one embodiment, the reference frame of the tool 100 has a first reference axis extending along a center line of the track 192, a second reference axis orthogonal to the first reference axis, and a third reference axis orthogonal to both the first and second reference axes. The sensor unit 200 is positioned at a precise location on the mounting module 120 by interconnecting a positioning element on the sensor unit 200 with a positioning element on the mounting module 120. When the positioning elements are interconnected, the sensor unit 200 is positioned at a known location in the three-dimensional navigational volume of the reference frame defined by the mounting module 120.

The controller 210 can be a computer. The controller 210 can be coupled to the sensor unit 200 and the robot 193 to control the movement of the robot during calibration as well as operation. The controller 210 can be the same computer that operates the chambers 170, the lift-rotate units 180, and the load/unload module 198, but in other embodiments the controller 210 can be a separate computer that interfaces with other computers in the tool 100. The controller 210 includes a computer operable medium, such as software and/or hardware, that contains instructions to perform embodiments of calibration methods in accordance with the invention.

Figure 10:
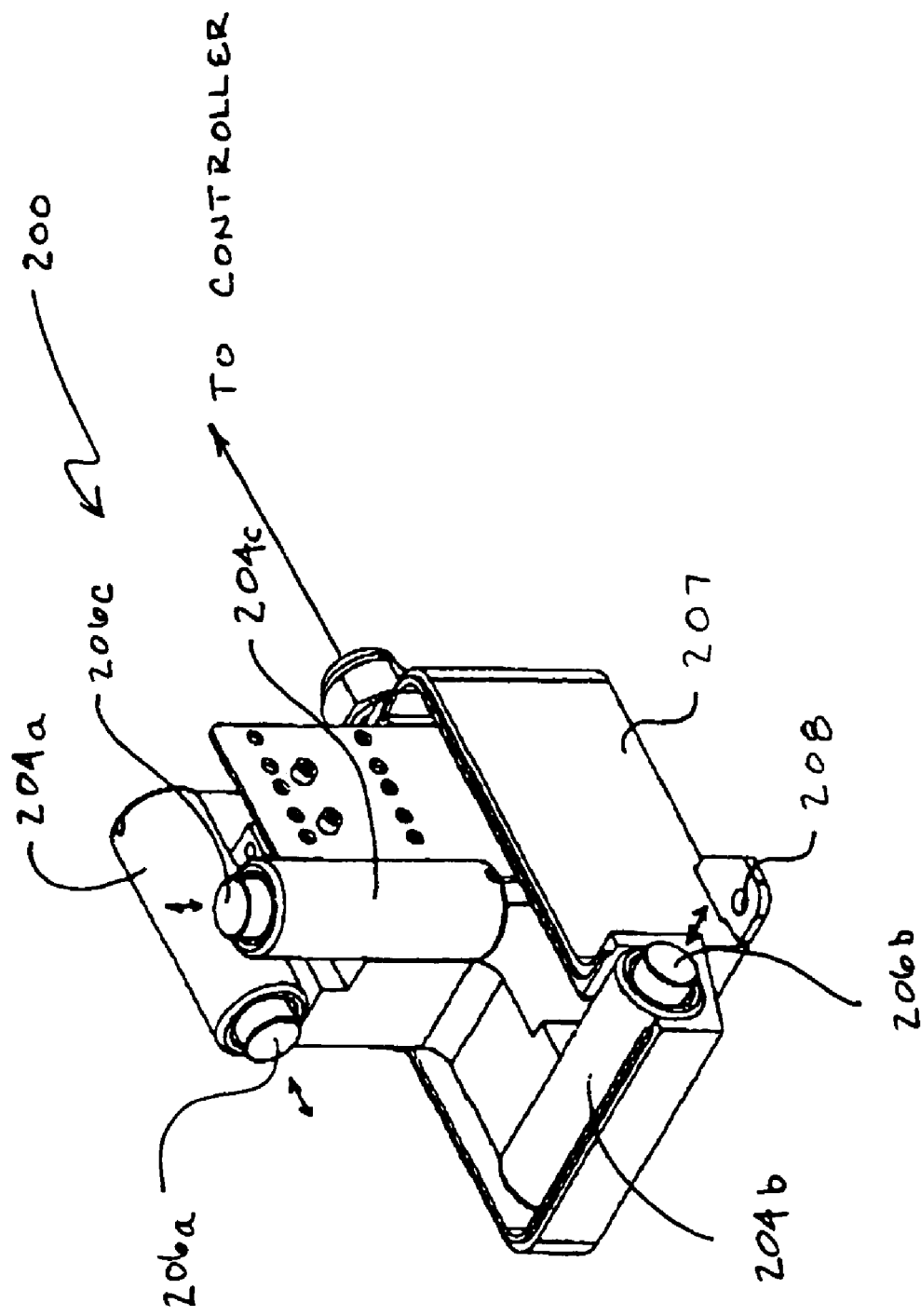
FIG. 10 is an isometric view of a sensor unit for use in an automated calibration system in accordance with an embodiment of the invention.

FIG. 10 is an isometric view showing an embodiment of the sensor unit 200. In this embodiment, the sensor unit 200 includes a plurality of sensors 204 (identified individually by reference numbers 204a–c). The sensors 204a–c can be arranged along three orthogonal axes corresponding to the first-third reference axes of the reference frame. This embodiment of the sensor unit 200 more specifically includes a first sensor 204a parallel to a first reference axis that coincides with the center line of the track 192 (FIG. 9), a second sensor 204b defining a rotation sensor, and a third sensor 204c defining an elevation sensor. The sensors 204 can be linear displacement transducers having spring-loaded displacement members 206 (identified individually by reference numbers 206a–c). The displacement members 206 produce an electrical signal corresponding to the extent of linear displacement.

The sensors 204 can be mounted to a frame 207 that has at least one positioning and/or attachment element 208. The frame 207 is constructed to properly align the sensors 204 along the three reference axes, and the element 208 can be configured to precisely locate the frame 207 relative to a known location on the mounting module 120.

The sensor unit 200 can have other embodiments that are different than the embodiment shown in FIG. 10. For example, the sensor unit 200 can have only a single sensor, or any number of sensors. The sensors also do not need to be arranged along three orthogonal axes. The sensor unit 200 can also have other types of sensors that measure angular displacement or indicate contact without indicating any displacement.

Figure 11:
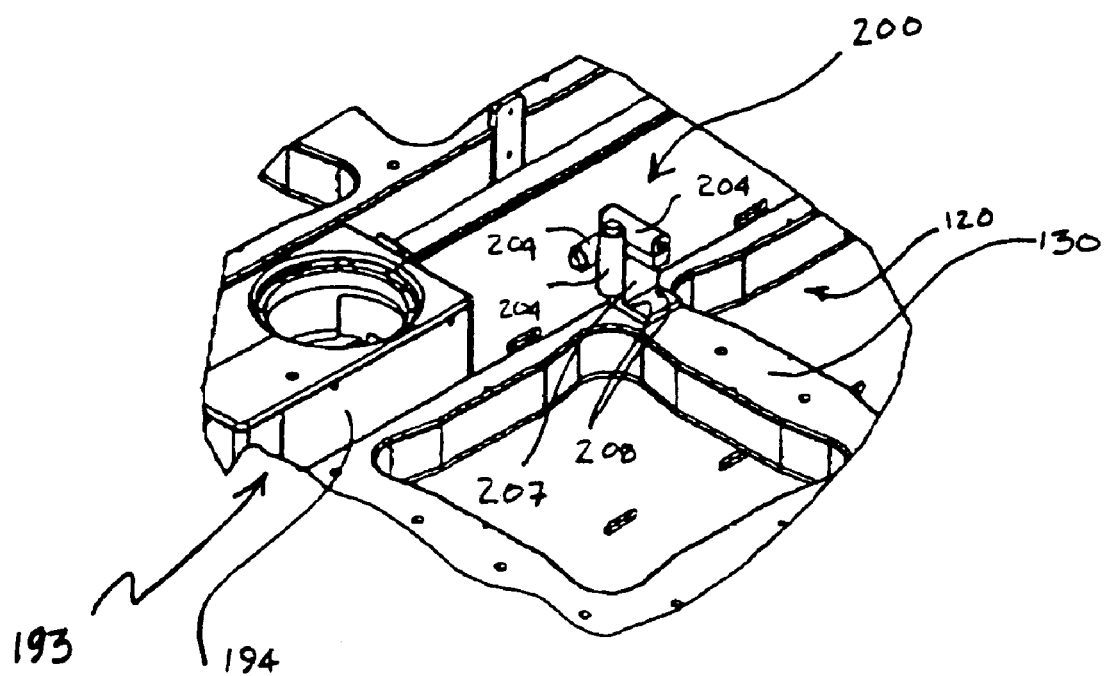
FIG. 11 is an isometric view of a sensor unit attached to a mounting module in accordance with an embodiment of the invention.

FIG. 11 is an isometric view of the embodiment of the sensor unit 200 shown in FIG. 10 mounted to the deck 130 of the tool 100. In this embodiment, the positioning/attachment elements 208 interface with corresponding positioning/attachment elements on the deck 130 to position the frame 207 at a precise location with respect to the mounting module 120. The sensors 204 are positioned proximate to the region of the track to interface with the robot 193. For purposes of clarity, only the base unit 194 of the robot 193 is shown in FIG. 11, but it will be appreciated that the arm assembly 195 is received in the large annular opening of the base unit 194 and chambers 170 are attached to the mounting module 120.

FIG. 12 is a flow chart illustrating a method 300 for calibrating the transport system 190 to the mounting module 120 in accordance with an embodiment of the invention. The calibration method 300 shown in FIG. 12 includes several different procedures. It will be appreciated, however, that not all of the procedures shown in FIG. 12 are necessary for several other embodiments of calibration methods in accordance with the invention.

The calibration method 300 includes an arm input procedure 310 for inputting a value to the controller 210 corresponding to the rotational position of the arm relative to the first axis of the reference frame. In one embodiment, the arm input procedure 310 provides an input value based on an estimated alignment of an arm axis along the arm with a first reference axis along the track 192.

Figure 13A:
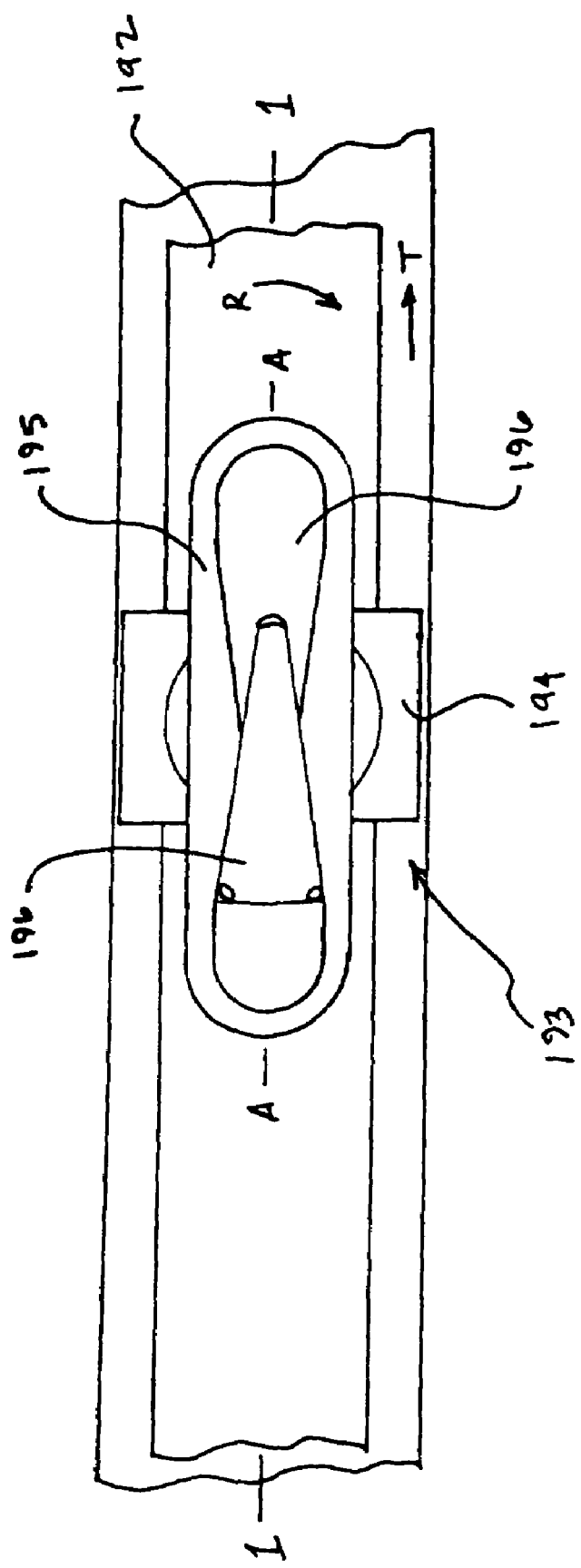
FIGS. 13A and 13B are top plan views illustrating specific stages of a method for calibrating a transport system in accordance with an embodiment of the invention.

Referring to FIG. 13A, the arm input procedure 310 can include manually rotating the arm 195 to align an arm axis A—A of the arm 195 with the first reference axis 1—1. Although an operator can generally come fairly close to aligning the arm axis A—A to the first reference axis 1—1 by visually "eye-balling" the position of the arm 195 relative to the track 192, there is typically a slight offset between the arm axis and the first reference axis. It will be appreciated that optical sensors or other types of indicia can also be used to initially align the arm 195 with the first reference axis 1—1.

After aligning the arm 195 with the first reference axis 1—1, the operator actuates a button on the tool 100 to input the encoder value of the rotational position of the arm 195. The button can be an external button on the tool 100 or a screen display button on a display screen associated with the computer operable medium of the controller 210 that runs the method 300. The initial rotational input value is accordingly an initial approximation of the reference position of the arm axis A—A.

Figure 13B:
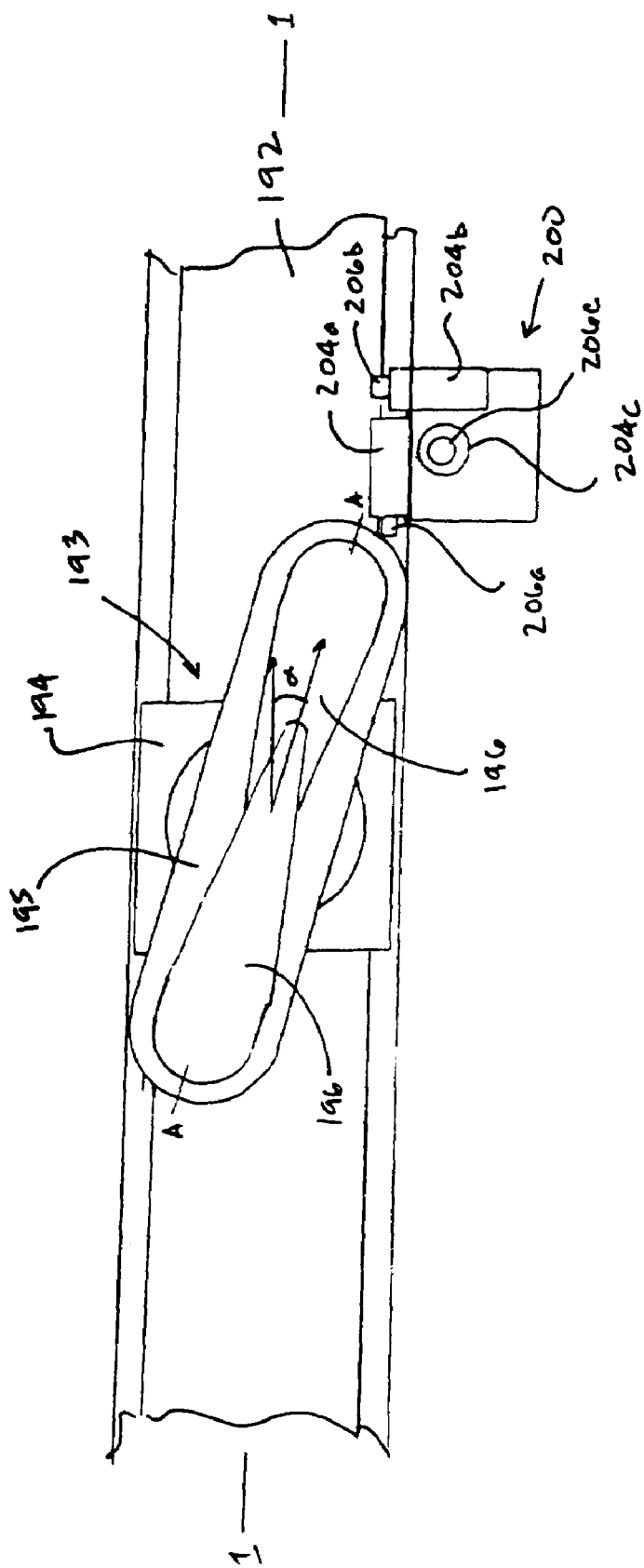

Referring again to FIG. 12, the method 300 also includes a base input procedure 320 that provides an initial input value of the axial position of the base along the track. Referring to FIG. 13A, the base input procedure includes rotating the arm 195 (arrow R) and translating the base 194 along the track 192 (arrow T). Referring to FIG. 13B, the arm 195 is rotated with respect to the track 192 and the base 194 is translated along the track 192 until a distal portion of the arm 195 contacts the displacement member 206a of the first sensor 204a. The displacement of the displacement member 206a causes the first sensor 204a to send a signal to the controller 210. The angle of the arm is determined by the controller 210 using the rotational input value of the arm from the arm input procedure 310 and the encoder value of the position of the arm 195 in FIG. 13B. The controller 210 can then calculate the position of the base 194 along the track 192 based on the angle α and the signal from the sensor 204a. The encoder value for the base 194 at this position can accordingly define an initial axial reference value for the base 194 along the first axis 1—1 of the reference frame.

The actual axial position of the base 194 along the track 192 may be slightly different than the calculated position because the arm 195 may not have been aligned accurately with the first reference axis 1—1 in the procedure 310. The additional procedures of the method 300 can automatically position the arm in better alignment with the first reference axis 1—1 and determine the actual axial location of the base along the first reference axis. Moreover, additional procedures of the method 300 can automatically determine the elevation of an end-effector with respect to the reference frame and automatically position an end-effector in alignment with respect to the first reference axis or another reference axis.

Referring to FIG. 12, the method 300 further includes an automated arm procedure 330 that refines the alignment of the arm axis A—A with the first reference axis 1—1. The automated arm procedure 330 can be controlled by the controller 210 based upon the initial rotational input value for the arm provided by the arm input procedure 310 and the initial axial input value for the base provided by the base input procedure 320. Referring to FIG. 14A, the controller 210 causes the base 194 to translate along the track 192 until the base 194 reaches a first predetermined position $x_1$. The controller 210 then causes the arm 195 to rotate until it contacts and moves the second displacement member 206b of the second sensor 204b (i.e., rotational sensor). The movement of the displacement element 206b sends a signal to the controller 210. When the signal from the displacement member 206b reaches a predetermined value corresponding to a desired displacement, the controller 210 stops rotating the arm 195 and records an encoder value corresponding to the rotational position of the arm 195. The encoder value for the position of the arm 195 in FIG. 14A is compared with the encoder value for the initial rotational position of the arm provided by the arm input procedure 310, which is indicative of an angle $\beta_1$ corresponding to the angle between the arm axis A—A and the first reference axis 1—1.

The automated arm procedure 330 continues by translating the base 194 along the track 192 and performing a similar procedure with the opposite end of the arm 195. FIG. 14B shows this stage of the automated arm procedure 330. The controller 210 causes the base 194 to translate along the track 192 until the base reaches a second predetermined reference point $x_2$, and then the controller 210 causes the arm 195 to rotate until it depresses the second displacement member 206b by a predetermined value. The controller 210 accordingly notes the encoder value of the rotational position of the arm 195 corresponding to an angle $\beta_2$. Based upon the encoder values for the arm 195 at the position $\beta_1$ shown in FIG. 14A and the position $\beta_1$ shown in FIG. 14B, the controller 210 determines an arm offset value corresponding to the extent that the arm 195 was misaligned with the first reference axis 1—1 during the arm input procedure 310. The controller 210 then causes the arm 195 to rotate according to the offset value so that the arm axis A—A is aligned with the first axis 1—1.

Figure 15:
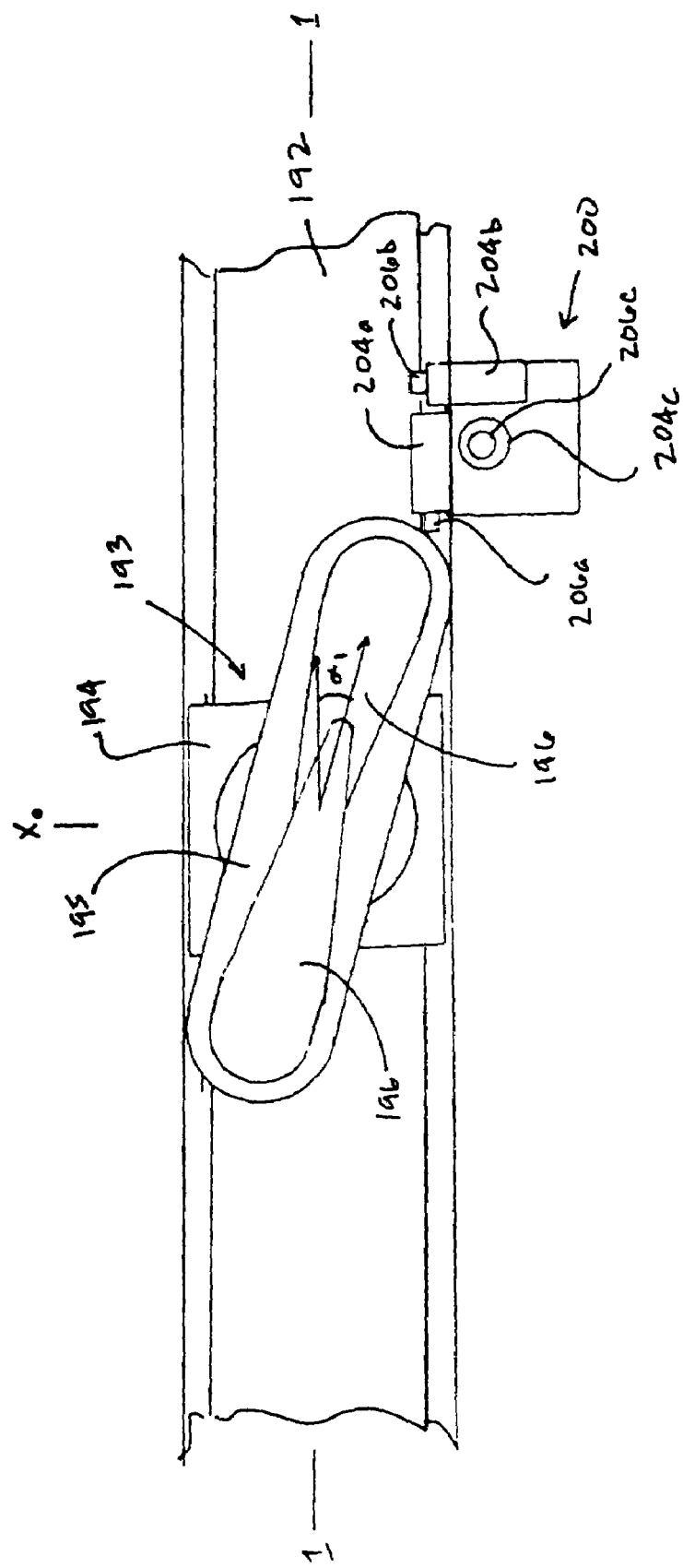
FIG. 15 is a top plan view of another stage for calibrating a robot of a transport system in accordance with an embodiment of the invention.

Referring to FIG. 12, the calibration method 300 can further include an automated base procedure 340 for refining the initial axial input value for the base along the first axis 1—1. Referring to FIG. 15, the controller 210 effectuates the automated base procedure 340 by rotating the arm 195 until it reaches an angle $\alpha_1$ and then translating the base 194 until the distal portion of the arm 195 displaces the first displacement member 206a by a predetermined distance. The angle $\alpha_1$ shown in FIG. 15 is an encoder value corresponding to a predetermined position for the arm during the automated base procedure 340. This encoder value is accurate because the automated arm procedure 330 eliminates or at least mitigates the error in positioning the arm 195 in alignment with the first reference axis 1—1 in the arm input procedure 310. The controller 210 accordingly records an axial origin encoder value of the base 194 at $x_0$ to refine the axial reference location of the base 194 along the track 192.

Referring again to FIG. 12, the method 300 can further include an automated elevation procedure 350 that determines a reference elevation of the arm and/or end-effector with respect to the reference frame. Referring back to FIG. 15, the controller 210 effectuates the automated elevation procedure 350 by raising the arm 195 so that it is above the third sensor 204c (i.e., the elevation sensor). The controller 210 then translates the base 194 along the track 192 and rotates the arm 195 beyond the angle $\alpha_1$ to position a reference surface on the under side of the arm 195 directly over the third sensor 204c. After the reference surface on the arm 195 is superimposed over the third sensor 204c, the controller 210 lowers the arm 195 until it displaces the third displacement element 206c by a predetermined distance and records an encoder value corresponding to the reference elevation of the arm 195 along an elevation axis.

Figure 16A:
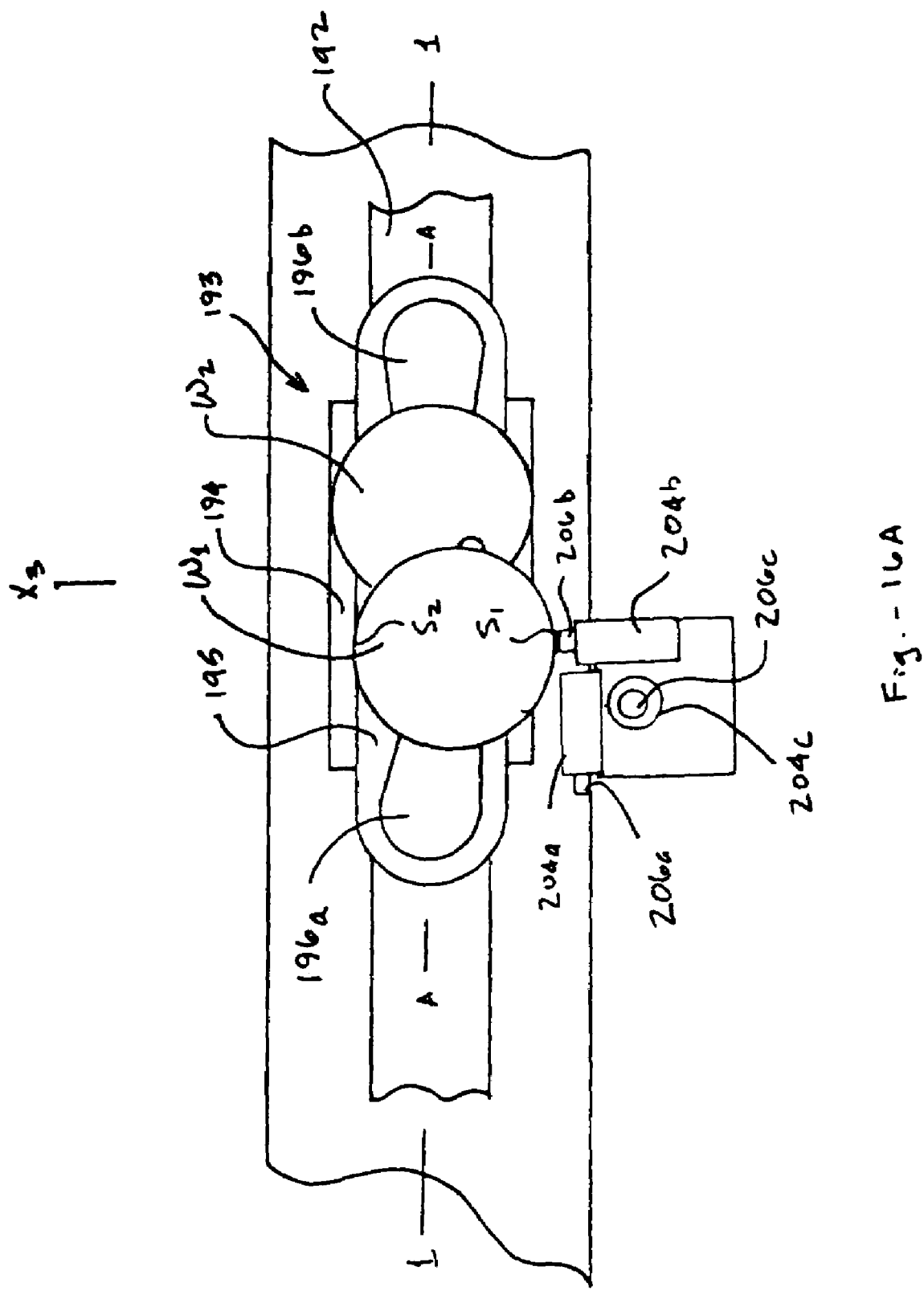

Referring again to FIG. 12, the method 300 can further include an automated end-effector procedure 360 that positions one or both end-effectors in alignment with respect to an axis of the reference frame. Referring to FIG. 16A, the controller 210 rotates the arm 195 until it reaches the encoder value at which the arm axis A—A is aligned with the first reference axis 1—1. The controller also translates the base 194 along the track 192 until the base is positioned at a known location $X_3$ along the first reference axis 1—1. The controller then rotates the first end-effector 196a until a first side $S_1$ of a first wafer $W_1$ engages the second displacement element 206b. The controller 210 receives a signal when the second displacement element 206b reaches a predetermined position and records the encoder value of the rotational position of the first end-effector 196a with respect to the first reference axis 1—1. Referring to FIG. 16B, the controller continues the automated end-effector procedure 360 by translating the base 194 until it is positioned at a predetermined location $x_4$ along the first reference axis 1—1 and rotating the first end-effector 196a until a second side $S_2$ of the workpiece $W_1$ engages the second displacement element 206b. The controller 210 similarly records an encoder value corresponding to the rotational position of the first end-effector 196a relative to the first reference axis 1—1 when the second displacement element 206b reaches a predetermined value. The controller 210 then determines an end-effector offset value according to the encoder values of the first end-effector 196a recorded in the automated end-effector procedure 360 at the stages shown in FIGS. 16A and 16B. The controller 210 can then rotate the first end-effector 196a according to the end-effector offset value to align the first workpiece $W_1$ with the first reference axis 1—1 or another reference axis of the reference frame. The controller 210 can also repeat the automated end-effector procedure 360 for the second end-effector 196b to align the second end-effector 196b with the first reference axis 1—1.

The embodiment of the automated end-effector procedure 360 described above is expected to be highly accurate because it aligns the end-effectors according to the actual position of the workpieces. In production, an end-effector typically holds workpieces at a consistent location on the end-effector. Some end-effectors, however, may consistently hold workpieces out of alignment with the alignment axis of the end-effector. The automated end-effector procedure 360 accurately aligns the end-effectors irrespective of how the end-effectors hold workpieces because the measurements are taken from the perimeter of the workpieces. This eliminates errors from holding workpieces off center with respect to the end-effectors.

The calibration system 300 illustrated in FIG. 12 can have several different embodiments that include fewer procedures, different types of procedures, or additional procedures. For example, the controller 210 can automate the arm input procedure 310 and the base input procedure 320 by adding optical or magnetic sensors to determine the initial rotational value for the arm and the initial axial value for the base. In other embodiments, the method 300 may perform just the automated arm procedure 330 and/or the automated end-effector procedure 360 to accurately position the arm 195 and/or the end-effector 196 along the first reference axis 1—1.

The robot calibration system is particularly valuable when used in combination with the mounting module 120 because it is not necessary to teach the robot the position of each chamber after calibrating the transport system. Because the chambers 170 and the lift-rotate units 180 are mounted to the mounting module 120 at precise locations and the mounting module 120 is dimensionally stable, the locations for loading/unloading the wafers with respect to the chambers are known relative to the reference frame of the mounting module 120. Additionally, when the robot 193 is installed and calibrated using the sensor unit 200 and the controller 210 to accurately align the end-effectors 196a–b in the reference frame, the robot 193 can then operate with the various chambers 170, lift-rotate units 180, and the load/unload module 198 without manually teaching the robot the specific location of each chamber and cassette. As such, the robot 193 can be calibrated to operate with all of the chambers and cassettes in merely a few minutes instead of the several hours that it now takes to manually teach robots the specific location of each chamber and cassette.

The automated calibration system and dimensionally stable mounting module provide significant operating savings because the downtime for maintaining or replacing robots is significantly less compared to conventional tools. Moreover, the downtime for the tool 100 is further reduced for repairing or replacing the chambers 170 and/or the lift-rotate units 180 for the reasons explained above. The integrated tool 100 with the dimensionally stable mounting module 120 and the automated calibration system for the robot 193, therefore, provides a significant advantage over conventional tools that suffer from extensive downtime for routine maintenance.

The robot calibration system can also be operated by teaching the robot 193 the specific location of a component in the tool one time instead of each time the robot or the component is replaced. For example, several components added to the tool 100 may not have positioning elements to interface with the positioning elements on the mounting module 120. The wafer location of such components will not be a known location relative to the reference frame of the mounting module 120. For this application, the components can be attached to the mounting module and then the robot can be taught the specific location of the component. The robot only needs to be taught the specific location once because the mounting module 120 is dimensionally stable. Thus, the robot does not need to relearn the specific location after maintenance or installation.

Another advantage of several embodiments of the calibration system is that the robot is accurately positioned within the reference frame for operating with the chambers 170, the lift-rotate units 180, and the load/unload module 198. One challenge of manually teaching the robot the specific location of each chamber or other component in a tool is that slight calibration errors can result in significant operating errors in production. This can result in chipped or broken wafers when the robot moves the wafers to an incorrect location. Several embodiments of the automated calibration system and the mounting module are expected to reduce such issues because operator error in calibrating the robot is eliminated. It will be appreciated that such accurate calibration of the robot to the other components of the tool 100 eliminates a significant source of frustration for semiconductor fabricators and other operators of integrated tools.

F. Embodiments of End-Effectors

FIGS. 17A–20 illustrate embodiments of the end-effector 196 that can be used with the transport system 190 of the tool 100. These embodiments of the end-effector 196 are quite valuable when used with the automated calibration system described above because they center the workpieces. The end-effector 196 shown in FIGS. 17A–20 is a three-point edge-grip end-effectors, but it can have four or more contact points in other embodiments. Several aspects of the end-effectors 196 are similar to the end-effectors described in U.S. Pat. No. 6,318,951 and U.S. application Ser. Nos. 10/194,939 and 10/620,326, all of which are incorporated by reference herein.

FIG. 17A is an isometric view illustrating one embodiment of the end-effector 196. In this embodiment, the end-effector 196 has a body 410, a first passive retainer 420a at a distal end of the body 410, and an active retainer assembly 430 having rollers 450 near a proximal end of the body 410. The body 410 can be solid member, or it can have holes or slots to mitigate backside contamination. The first passive retainer 420a can have a support surface 422 for supporting an edge portion of a workpiece and an edge stop 424 projecting upwardly from the support surface 422. The edge stop 424 can have a contact surface 426 for pressing radially inwardly against a peripheral edge of a workpiece. The first passive retainer 420a can also have an inclined surface 428 sloping downwardly from the support surface. The end-effector 196 can also include second and third passive retainers 420b–c near the active retainer assembly 430 at the proximal end of the body 410. The second and third passive retainers 420b–c can be similar to the first passive retainer 420a. The support surfaces 422 are spaced apart from the body 410 to prevent the workpiece from contacting the body 410 for mitigating contamination of the end-effector 196 and/or the backside of the workpiece.

In operation, the robot 193 (FIGS. 2B and 9) positions the body 410 under a workpiece and raises the end-effector 196 until the workpiece contacts the support surface 422 and/or the guide surfaces 428. The active retainer assembly 430 then moves forward (arrow F) to engage the rollers 450 with the peripheral edge of the workpiece (not shown in FIG. 17A). The end-effector 196 accordingly holds a workpiece between the rollers 450 and the first passive retainer 420a. A workpiece can be removed from the end-effector 196 by moving the active retainer assembly 430 backward (arrow B) to disengage the rollers 450 from the workpiece.

FIG. 17B is an isometric view illustrating details of the active retainer assembly 430 shown in FIG. 17A. In this embodiment, the active retainer assembly 430 includes an actuator 432 and a yolk 436 coupled to the actuator 432. The actuator can be a pneumatic or hydraulic cylinder that moves the yolk 436 along a guide 437. The active retainer assembly 430 can further include a sensor unit 438 to determine the position of the yolk 436. The sensor unit 438 can be coupled to the controller to indicate when the yolk 436 is in a fully retracted position to receive a workpiece or in the fully extended position to securely hold a workpiece on the end-effector 196.

The rollers 450 are rotatably attached to each side of the yolk 436. The embodiment of the end-effector shown in FIG. 17B has two rollers 450 on each side of the yoke 436, but other embodiments can have only a single roller on each side of the yolk 436. The rollers 450 have grooves 452 for receiving the peripheral edge of a workpiece and securely holding the workpiece on the end-effector 196. The rollers 450 accordingly define active retainers for engaging the edge of a workpiece. Other embodiments of the end-effector can have different types of active retainers mounted to the yolk 436 in addition to or in lieu of the rollers 450.

Figure 19:
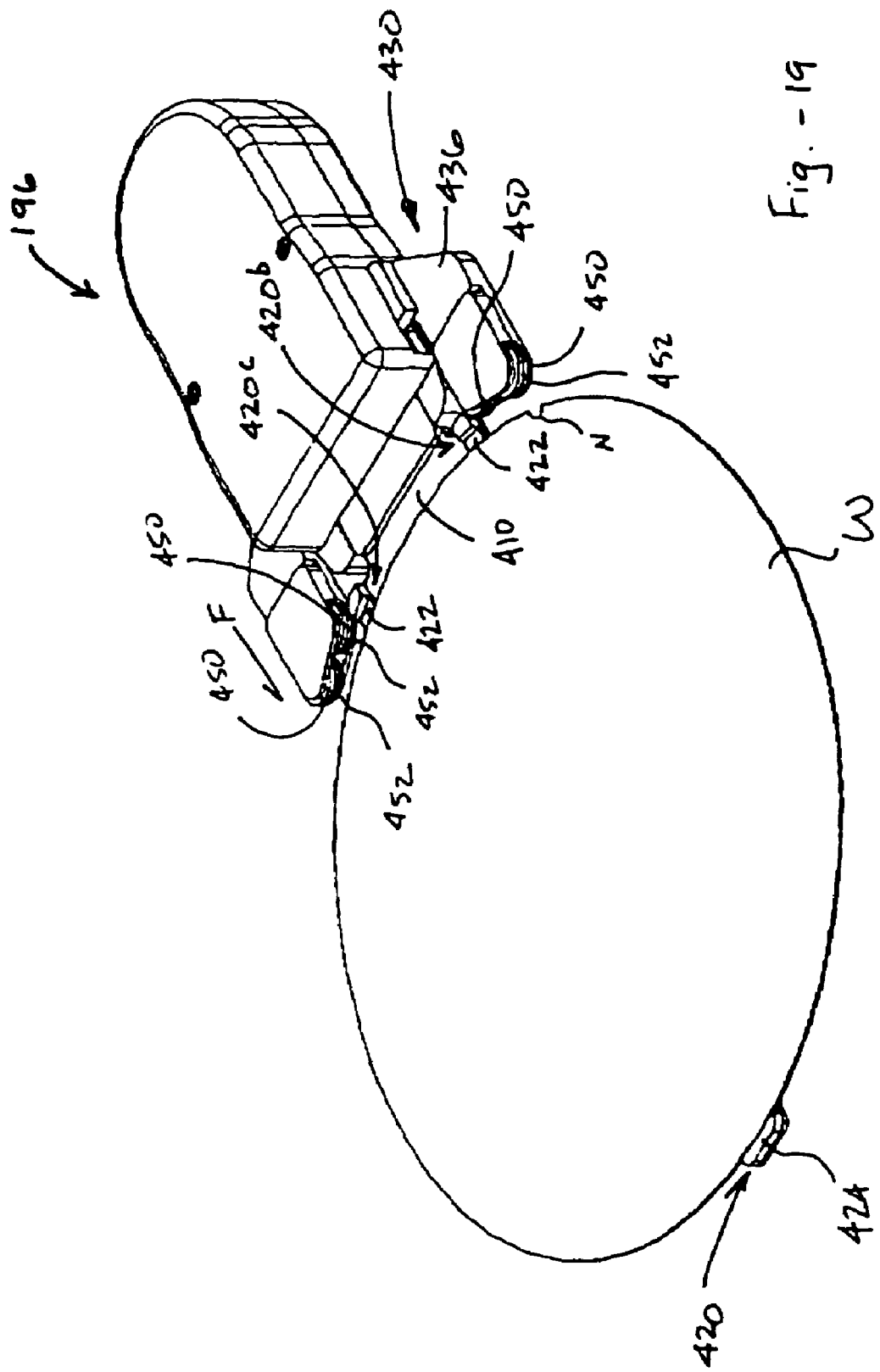
FIG. 19 is an isometric view of the end-effector shown in FIGS. 17A and 17B.

FIG. 18 is a top plan view of the end-effector 196 and FIG. 19 is an isometric view of the end-effector 196 with a workpiece W. These Figures further illustrate the purpose of the rollers 450 in more detail. More specifically, as the active retainer assembly 430 moves forward (arrow F) to hold the peripheral edge of the workpiece W in the grooves 452 of the rollers 450, the workpiece W is centered as it is clamped between the first passive retainer 420a and the rollers 450. For example, if the workpiece is skewed relative to the body 410, the workpiece W will rotate along the rollers 450 as the yolk 436 moves in the forward direction F. The movement of the rollers 450 accordingly centers the workpiece W relative to the body 410. Moreover, by having two rollers 450 in a stepped or angled arrangement on each side of the yolk 436, the rollers 450 cause the workpiece W to rotate relative to the body 410 even when an alignment notch N (FIG. 19) is positioned at one of the rollers 450.

Figure 20:
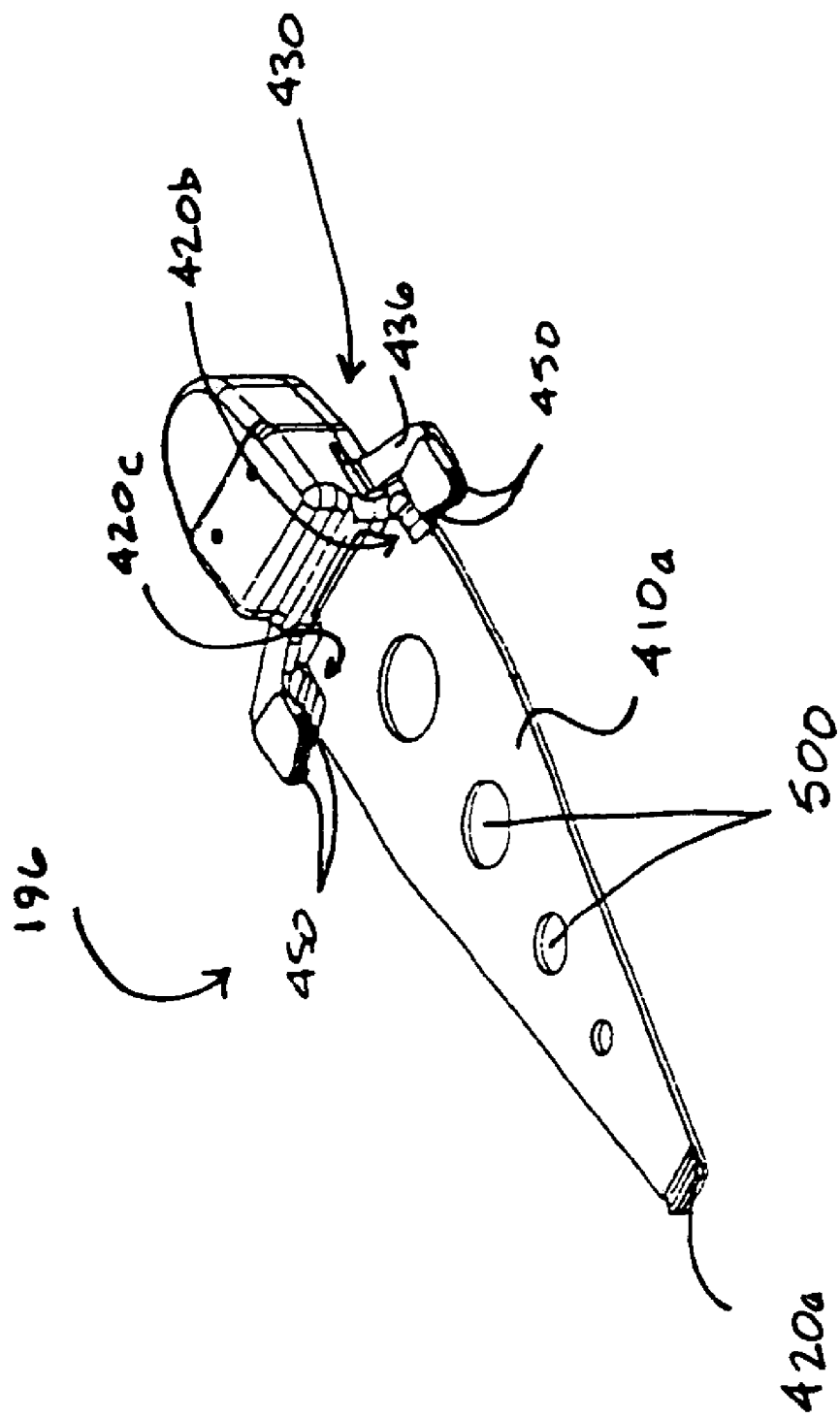
FIG. 20 is an isometric view of another embodiment of an end-effector for use in a transport system in accordance with another embodiment of the invention.

FIG. 20 is an isometric view of another embodiment of the end-effector 196. This embodiment is similar to the embodiment shown in FIGS. 17A–19, and like reference numbers refer to like components in FIGS. 17A–20. The embodiment of the end-effector 196 in FIG. 20 has a body 410a with a plurality of openings 500. The openings 500 can be circular, rectilinear or any other suitable shape. The openings 500 reduce the weight of the body to reduce the inertia of the end-effector 196. This is useful for large end-effectors used with 300 mm workpieces.

The embodiments of the end-effectors 196 shown in FIGS. 17A–20 are expected to provide more accurate handling of the workpieces W to increase the accuracy with which the robot 193 can transfer workpieces within the tool 100. By centering a workpiece W to the body 410, these embodiments of the end-effector 196 insure a consistent placement of the workpiece W relative to the other portions of the robot 193. As a result, these embodiments of the end-effector 196 are expected to eliminate or at least mitigate one source of error in automatically calibrating the robot 193 to accurately transfer workpieces among the chambers 170, lift-rotate units 180, and the load/unload module 198.

G. Workpiece Handling Units for Use With Processing Vessels

Figure 21:
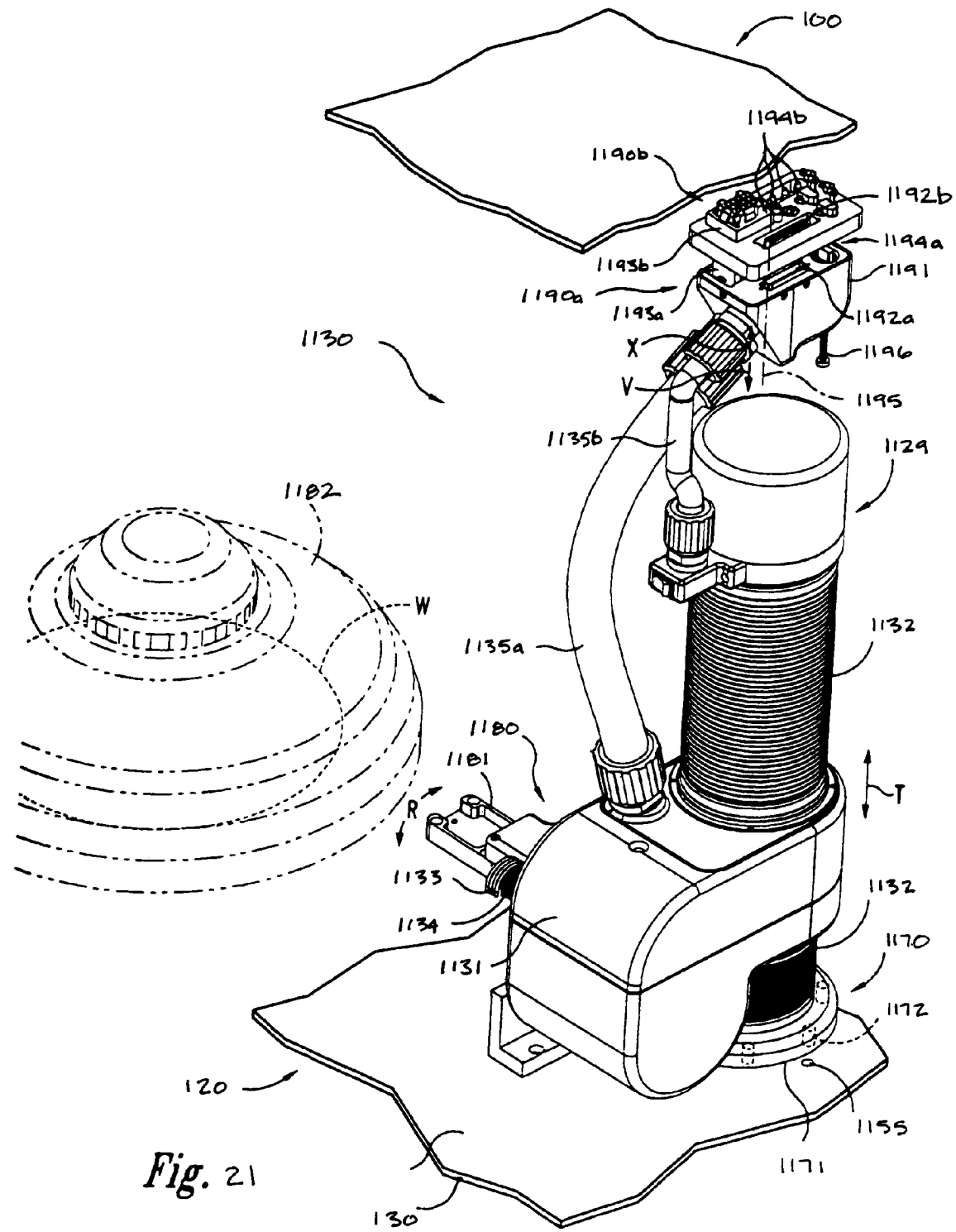
FIG. 21 is a partially schematic, isometric view of a workpiece handling apparatus configured in accordance with an embodiment of the invention.

FIG. 21 is a partially schematic, partially exploded isometric illustration of a workpiece handling apparatus 1130, such as the lift-rotate unit 180 described above with reference to FIG. 7. Like reference numbers accordingly refer to like components in FIGS. 7 and 21–26. The workpiece handling apparatus 1130 is configured to be releasably mounted to the mounting module 120 in accordance with an embodiment of the invention. In one aspect of this embodiment, the apparatus 1130 includes a moveable head 1182 that carries a microfeature workpiece W. The head 1182 is coupled to a head mount 1181 that rotates the head 1182 as indicated (by arrow R) to position the workpiece W face up or face down. The head mount 1181 is carried by a workpiece support 1180 having a housing 1131 and being configured to move upwardly and downwardly (as indicated by arrow T) to move the head 1182 and the workpiece W toward and away from a processing chamber. Connector assemblies 1190a and 1190b provide fluid and electrical communication between the workpiece handling apparatus 1130 and the rest of the tool 100. A mounting portion 1170 is configured to precisely and releasably secure the workpiece handling apparatus 1130 to the tool deck 130, as described in greater detail below.

The mounting portion 1170 can be the same as the collar 182 described above with reference to FIG. 7. The mounting portion 1170 includes a downwardly facing mounting surface 1171 precisely machined to mount flush against the deck 130. Accordingly, the mounting surface 1171 and the deck 130 precisely orient the handling apparatus 1130 relative to the tool 100 in the vertical direction. In a further aspect of this embodiment, the mounting portion 1170 includes second apparatus positioning elements 1172 positioned to precisely mate with the corresponding first apparatus positioning elements 1155 at the deck 130. The first apparatus positioning elements 1155 can be the same as the positioning elements 134, and the second apparatus positioning elements 1172 can be the same as the interface elements 184 described above with reference to FIG. 7. For example, in one embodiment, the first apparatus positioning elements 1155 include and/or carry pins and the second apparatus positioning elements 1172 include apertures sized and positioned to snuggly receive the pins. In another embodiment, the second apparatus positioning elements 1172 include and/or carry pins and the first apparatus positioning elements 1155 include apertures. In other embodiments, the configurations of the first apparatus positioning elements 1155 and the second apparatus positioning elements 1172 are different. In any of these embodiments, the correspondence between the first apparatus positioning elements 1155 and the second apparatus positioning elements 1172 is precisely maintained from one workpiece handling apparatus 1130 to the next. As a result, a workpiece handling apparatus 1130 can be removed from the deck 130 and replaced with another workpiece handling apparatus 1130 without requiring that the new apparatus 1130 be recalibrated.

The workpiece handling apparatus 1130 also includes fluid lines 1133, electrical lines 1134, and a first connector assembly 1190*a* configured to be releasably connected to a second connector assembly 1190*b* carried by the tool 100. In a particular aspect of this embodiment, the first connector assembly 1190*a* includes a housing 1191 carrying a low voltage connector 1192*a* (e.g., for transmitting data signals to and from the workpiece handling apparatus 1130), a high voltage connector 1193*a* (e.g., for transmitting electrical power to the handling apparatus 1130), and fluid connectors 1194*a* (hidden from view in FIG. 21 and provided, e.g., to supply pressurized air, purge gas, and/or vacuum to the workpiece handling apparatus 1130). The second connector assembly 1190*b* includes a corresponding low voltage connector 1192*b*, a high voltage connector 1193*b*, and fluid connectors 1194*b*. In yet a further aspect of this embodiment, the first connector assembly 1190*a* is connected to and released from the second connector 1190*b* with motion along a single connector motion axis 1195, as indicated by arrows X and V. In one embodiment, a user can move the first connector assembly 1190*a* by grasping the connector housing 1191 and moving it along the connector motion axis 1195. In another embodiment, for example, when a substantial insertion force is required to mate the first connector assembly 1190*a* with the second connector assembly 1190*b*, the first connector assembly 1190*a* includes a captive screw 1196 that the user threadably attaches to the second connector assembly 1190*b* to draw the two connector assemblies 1190*a* and 1190*b* together.

In one embodiment, one set of fluid lines 1133 and electrical lines 1134 are routed from the first connector assembly 1190*a* through a first conduit 1135*a* to the workpiece support 1180. A second set of fluid lines 1133 and/or electrical lines 1134 (not visible in FIG. 21) are routed through a second conduit 1135*b* from the first connector assembly 1190*a* to a linear drive mechanism 1129. In a further aspect of this embodiment, the second conduit 1135*b* is generally rigid and the first conduit 1135*a* is flexible to accommodate motion of the workpiece support 1180 along the translation axis T. A bellows 1132 is also disposed around the linear drive mechanism 1129 to accommodate the motion. In one embodiment, the bellows 1132 includes Teflon® and in other embodiments, the bellows includes other flexible resilient materials of the linear drive mechanism 1129. Further details of the linear drive mechanism 1129 are described below with reference to FIG. 22.

Figure 22:
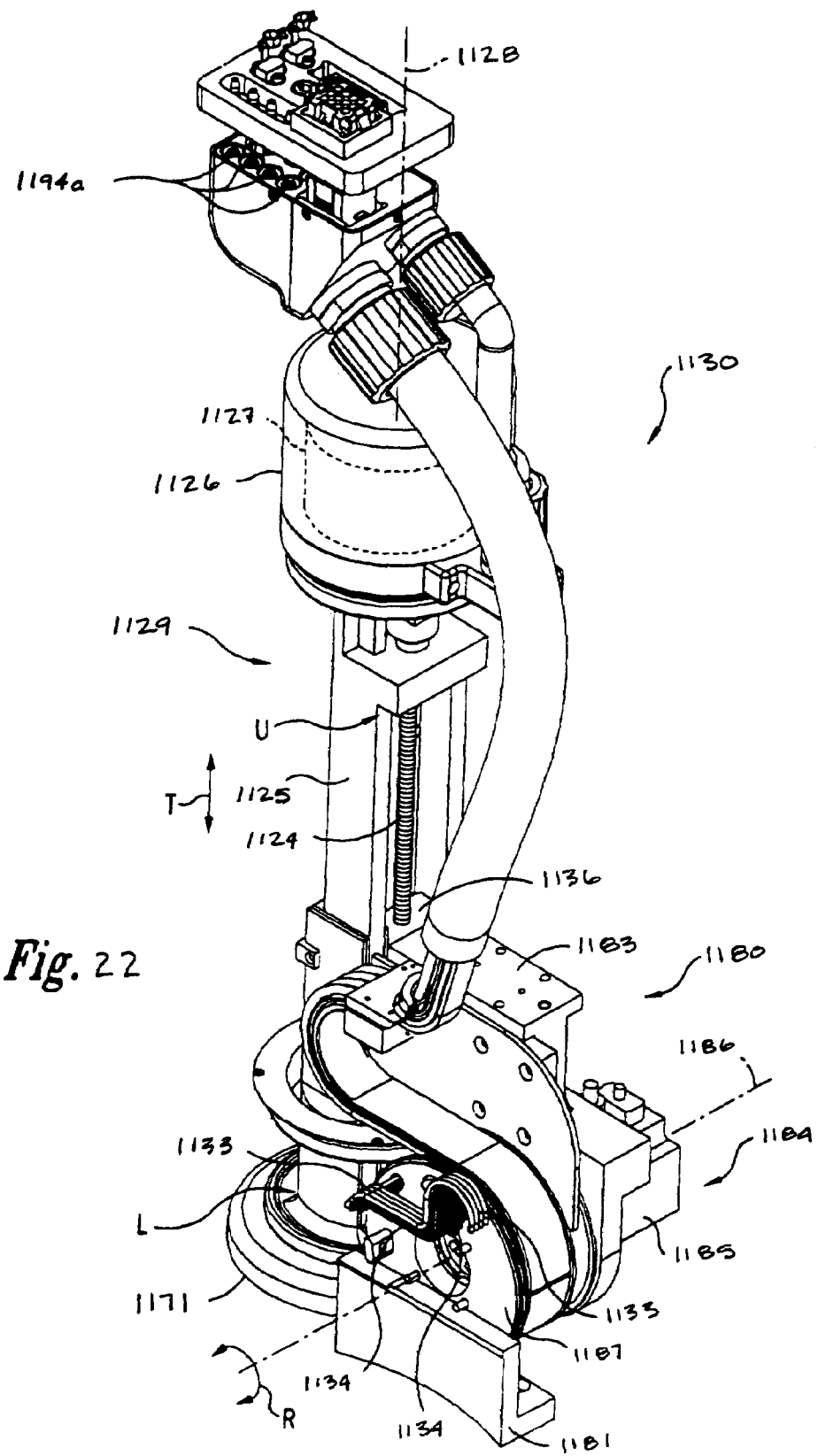
FIG. 22 is a partially schematic, isometric view of the workpiece handling apparatus shown in FIG. 21 showing details of internal features.

FIG. 22 is an isometric illustration of the handling apparatus 1130 with the housing 1131 and the bellows 1132 (shown in FIG. 21) removed for purposes of illustration. In one aspect of the embodiment shown in FIG. 22, the linear drive mechanism 1129 includes a linear drive motor 1127 positioned within a linear drive housing 1126. The linear drive motor 1127 is coupled to a lead screw 1124, which threadably engages the workpiece support 1180 at an interface 1136. In other embodiments, the linear drive mechanism 1129 includes other arrangements, for example, hydraulic or pneumatic actuators. In any of these embodiments, the linear drive mechanism 1129 moves the workpiece support 1180 upwardly and downwardly as indicated by arrow T along a linear motion axis 1128, and is guided by a linear track 1125. In one aspect of these embodiments, the interface 1136 moves between a lowermost position L and an uppermost position U along the linear axis 1128. The mounting surface 1171 is positioned generally normal to the linear motion axis 1128 and is located below the lowermost position L so that it does not intersect the linear motion axis 1128 between the lowermost position L and the uppermost position U.

In one embodiment, the apparatus 1130 also rotates the workpiece support 1180. Accordingly, the apparatus 1130 includes a rotary drive mechanism 1184. In a particular aspect of this embodiment, rotary drive mechanism 1184 includes a rotary drive motor 1185 coupled to a drum 1187 which is in turn coupled to the head mount 1181. In other embodiments, the rotary drive mechanism 1184 includes other arrangements. In one aspect of an embodiment shown in FIG. 22, the rotary drive motor 1185 rotates to the head mount 1181 clockwise and counterclockwise about a rotational motion axis 1186, as indicated by arrow R. In a particular aspect of this embodiment, the head mount 1181 rotates by about 180° between its extreme positions. As described in greater detail below with reference to FIG. 23, the fluid lines 1133 and electrical lines 1134 are arranged to accommodate this range of motion without binding.

Figure 23:
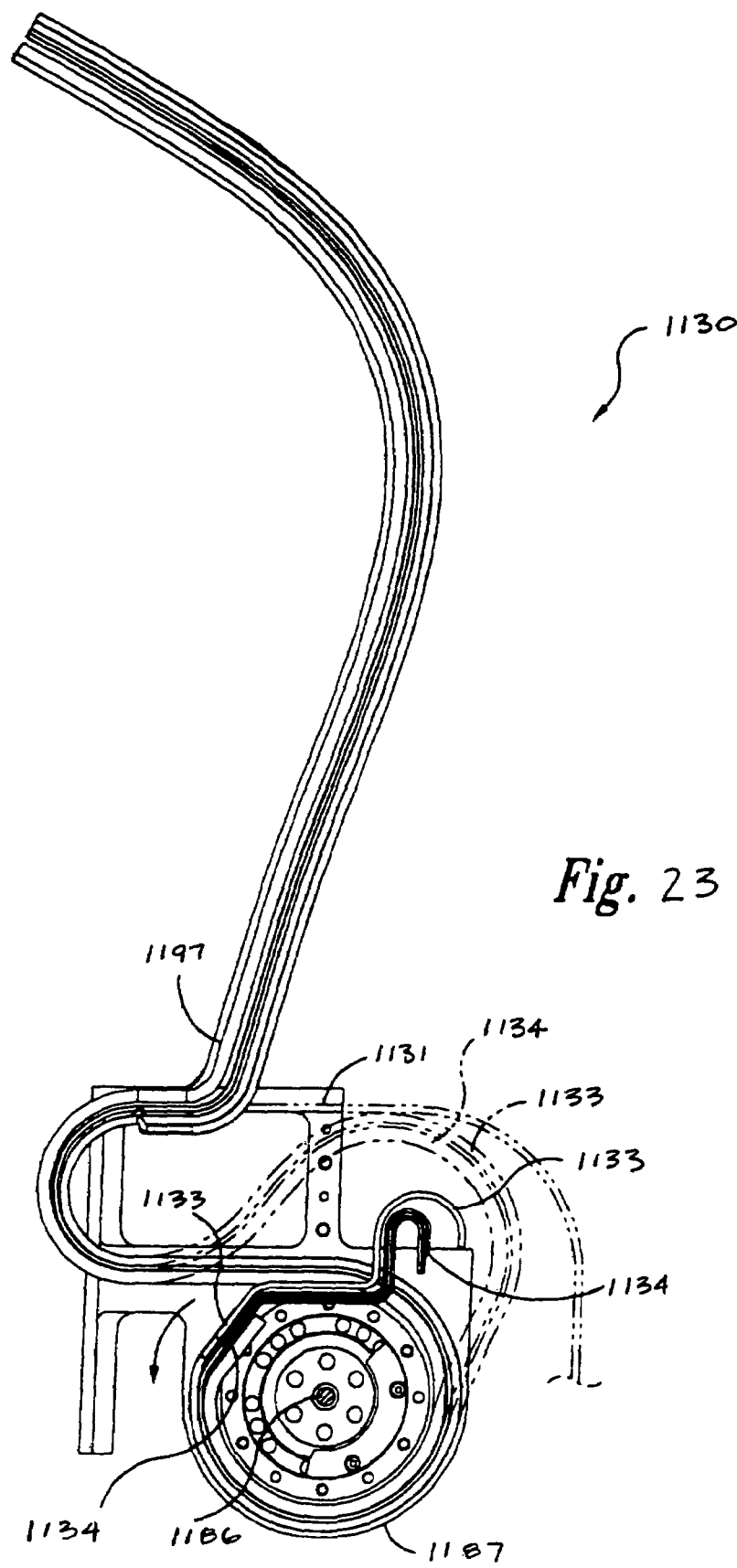
FIG. 23 is a partially schematic, endview of an arrangement for supporting fluid and electrical communication lines in accordance with an embodiment of the invention.

FIG. 23 is a partially schematic, side elevational view of a portion of the apparatus 1130 described above with reference to FIGS. 21 and 22. In one aspect of this embodiment, the fluid lines 1133 and the electrical lines 1134 are carried by the drum 1187 described above with reference to FIG. 22. Accordingly, the fluid lines 1133 and the electrical lines 1134 can extend from the generally fixed conduit 1135*a* (FIG. 21) to the rotating drum 1187. As the drum 1187 rotates counterclockwise about the rotational motion axis 1186, the lines 1133 and 1134 tend to unwind and lift off the drum 1187, as indicated in FIG. 23 by phantom lines. In a particular aspect of this embodiment, the housing 1131 is shaped to control and confine the motion of the unwinding lines 1133 and 1134, so that when the drum 1187 rotates clockwise, the lines 1133 and 1134 re-seat on the drum 1187.

In other embodiments, the lines 1133 and 1134 can have other arrangements. In any of these embodiments, the lines 1133 and 1134 attach to the head 1182, which is described in greater detail below with reference to FIG. 24.

Figure 24:
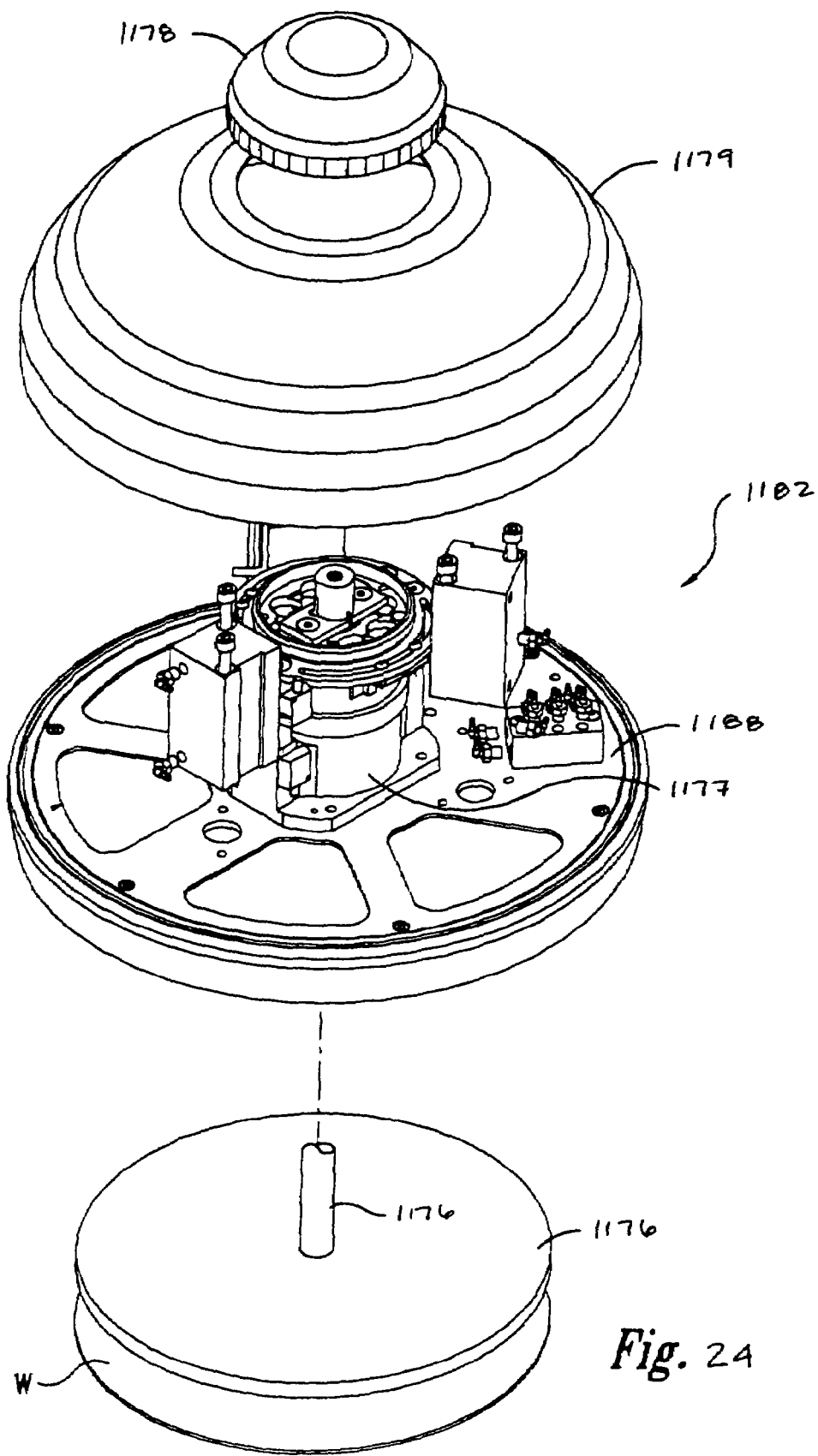
FIG. 24 is a partially schematic, exploded view of a workpiece support head configured in accordance with an embodiment of the invention.

Referring now to FIG. 24, an embodiment of the head 1182 includes a disc-shaped platform 1188 carrying a motor 1177. The motor 1177 is connected to a shaft 1176, and a support 1175 for releasably carrying the microfeature workpiece W is carried by the shaft 1176. In certain applications, the support 1175 has electrical contacts configured to engage the microfeature workpiece W. Such electrical contacts can apply an electrical potential to the microfeature workpiece W for electrochemically depositing a material onto the workpiece. The head 1182 also includes a protective cover 1179 and cap 1178 over the motor 1177 to shield the motor 1177 and other components from the environment within the tool 100.

One feature of several embodiments of the tool 100 and the workpiece handling apparatus 1130 described above is that the workpiece handling apparatus 1130 is connected to the tool 100 at the deck 130 as best shown in FIG. 21. For example, in a particular aspect of this embodiment, the mounting surface 1171 (which mates with the deck 130) is below the lowermost travel point of the interface 1136 with the workpiece support 1180. Accordingly, even if the workpiece W and/or portions of the head 1182 extend below the deck 130 during processing, the mounting surface 1171 is positioned at the deck 130. An advantage of this arrangement is that the workpiece handling apparatus 1130 is less likely to impede access to components of the tool 100 positioned below the deck 130. Such components include plumbing lines, pumps, valves, and associated hardware. As a result, the components below the deck 130 can be serviced without removing the workpiece handling apparatus 130. This reduces the time required to maintain and/or replace components located below the deck 130.

Another feature of embodiments of the workpiece handling apparatus 1130 described above is that it need not be calibrated after being attached to the tool 100. For example, in one embodiment, neither the mounting portions 1170, nor any structure connected between the mounting portion 1170 and the drive mechanism 1129, includes an adjustable mechanical device positioned to locate the workpiece support 1180 relative to the rest of the tool 100. In particular, the positioning elements 1155 and 1172 precisely align the workpiece handling apparatus 1130 with the tool 100. So long as components of the workpiece handling apparatus 1130 are aligned relative to the positioning elements 1172 and/or the mounting surface 1171 prior to installation on the tool 100 (e.g., during manufacture), these components need not be recalibrated when the workpiece handling device 1130 is installed. An advantage of this arrangement is that the workpiece handling apparatus 1130 can be fabricated so as to be fully calibrated and accordingly the length of time during which the tool is non-operational (e.g., during installation of a replacement workpiece handling apparatus 1130) need not be increased merely to recalibrate the workpiece handling device 1130.

Another feature of an embodiment of the workpiece handling apparatus 1130 described above is that the fluid and electrical lines 1133 and 1134 between the workpiece handling apparatus 1130 and the rest of the tool 100 are removably coupled at a single point. For example, an embodiment of the workpiece handling apparatus 1130 includes a single connector assembly 1190*a* that provides both electrical and fluid connections. In a further aspect of this embodiment, the single connector assembly 1190*a* can be attached to a corresponding connector assembly 1190*b* of the tool 100 with motion along a single axis. An advantage of both features is that the workpiece handling apparatus 1130 is accordingly more quickly and easily removed and replaced than are existing workpiece handling apparatuses.

Figure 25:
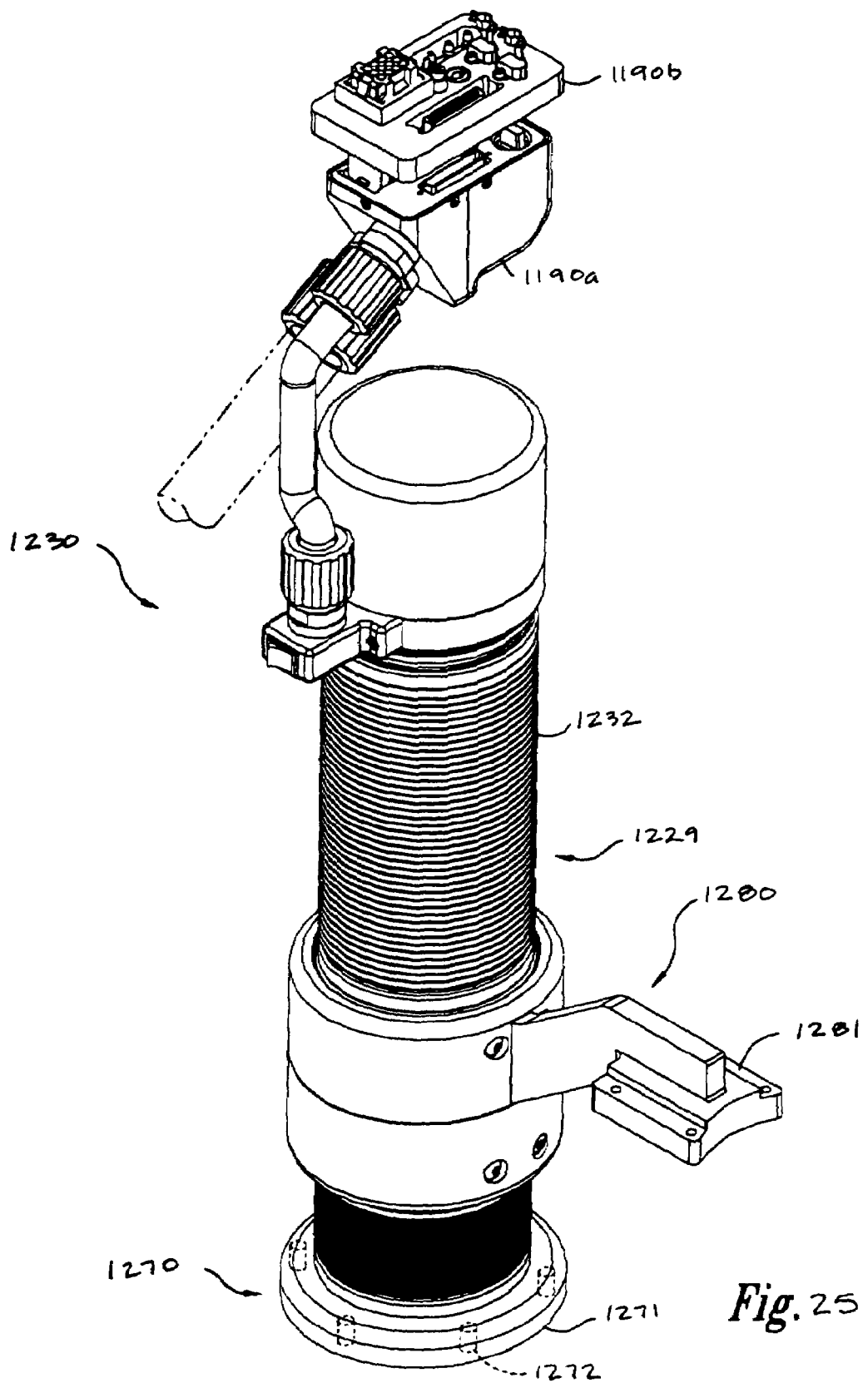
FIG. 25 is a partially schematic, isometric illustration of a workpiece handling apparatus configured to lift a workpiece in accordance with an embodiment of the invention.

FIG. 25 is a partially schematic, isometric illustration of a workpiece handling apparatus 1230 having a workpiece support 1280 with a head mount 1281 that translates but does not rotate in accordance with another embodiment of the invention. In one aspect of this embodiment, other elements of the apparatus 1130 are generally similar to corresponding elements described above with reference to FIGS. 21–24. For example, the apparatus 1230 includes the connector assemblies 1190*a* and 1190*b* that couple the fluid and electrical lines between the workpiece handling apparatus 1230 and other portions of the tool 100 at a single connection point. The workpiece handling apparatus 1230 includes a mounting portion 1270 having a flat mounting surface 1271 and positioning elements 1272 that align the apparatus 1230 relative to the deck of the apparatus described above. A bellows 1232 is positioned around portions of a linear drive mechanism 1229, which is described in greater detail below with reference to FIG. 26.

Figure 26:
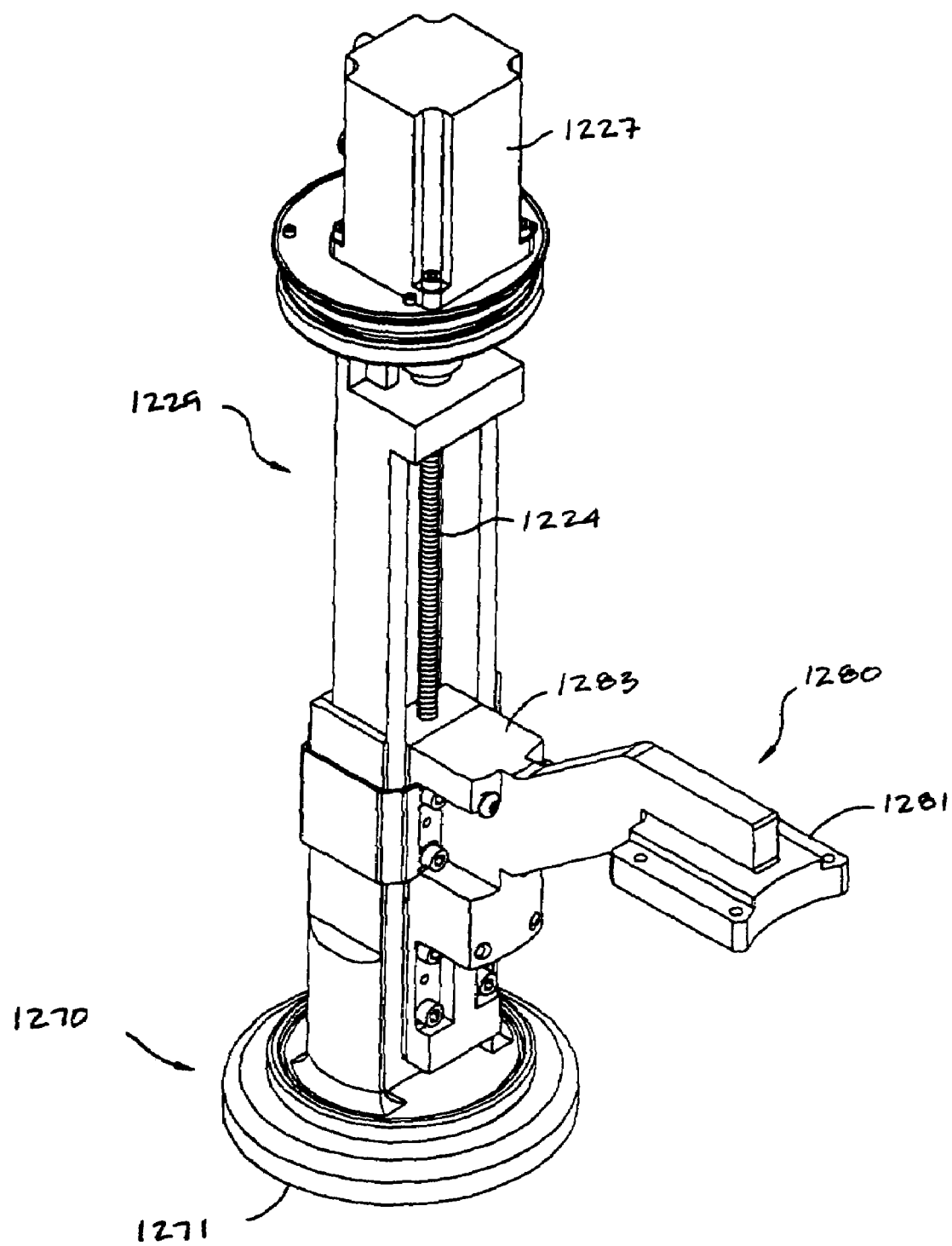
FIG. 26 is an illustration of internal features of an embodiment of the workpiece handling apparatus shown in FIG. 25.

FIG. 26 is a partially schematic, isometric illustration of an embodiment of the apparatus 1230 described above with reference to FIG. 25, with the bellows 1232 shown in FIG. 25 removed from the drive mechanism 1229 shown in FIG. 26. The linear drive mechanism 1229 includes a linear drive motor 1227, a lead screw 1224 coupled to the motor 1227, and a threaded driven portion 1283 of a head mount 1281 carried by the lead screw 1224. In other embodiments, the linear drive mechanism 1229 can have other arrangements. In any of these embodiments, the linear motion of the head mount 1281 is sufficient to position the workpiece W (not shown in FIG. 26) at the desired location of a processing station. Such an arrangement is used for particular application processes, including bevel etching the microfeature workpiece W in a capsule chamber.

From the foregoing, it will be appreciated that specific embodiments of the invention have been described herein for purposes of illustration, but that various modifications may be made without deviating from the spirit and scope of the invention. For example, several embodiments of transport systems and robots are described in the following U.S. application Nos., which are also incorporated herein by reference: (a) Ser. No. 10/080,914; and (b) Ser. No. 10/080, 915; and 60/484,604. Accordingly, the invention is not limited except as by the appended claims.

We claim:

1. An integrated tool for wet chemical processing of microfeature workpieces, comprising:

a frame a mounting module attached to the frame, the mounting module having a deck a plurality of positioning elements, and a plurality of attachment elements, wherein the deck comprises (a) a rigid first panel having a plurality of the positioning elements and a plurality of the attachment elements, (b) a rigid second panel juxtaposed to the first panel, (c) braces between the first and second panels, wherein the first panel, the braces and the second panel are fastened together to be dimensionally stable, and (d) a chamber receptacle through the first and second panels;

a wet chemical processing chamber attached to the deck of the mounting module, the wet chemical processing chamber having a first interface member engaged with one of the positioning elements and a first fastener engaged with one of the attachment elements, wherein a portion of the chamber is received in the chamber receptacle;

a transport system carried by the mounting module for transporting workpieces within the tool, the transport system having a second interface member engaged with one of the positioning elements, wherein the transport system has a second fastener engaged with another attachment element; and wherein the mounting module is configured to maintain relative positions between positioning elements such that the transport system does not need to be recalibrated when the processing chamber is replaced with another processing chamber.

2. The tool of claim 1 wherein the first panel, the second panel and the joists comprise stainless steel.

3. The tool of claim 1 wherein the first panel, the second panel and the joists comprise a fiber reinforced material.

4. The tool of claim 1 wherein the mounting module further comprises:

a platform having a plurality of the positioning elements and being fixedly disposed relative to the processing deck, and wherein the second interface member of the workpiece transport mechanism is engaged with a corresponding positioning element of the platform.

5. The tool of claim 4 wherein the chamber receptacle has a contact area supporting the chamber and a bulge outside of the chambers through which fluid and/or electrical lines can extend.

6. The tool of claim 4 wherein the chamber receptacle has contact areas and bulges between the contact areas, and wherein the bulges define openings outside of the chambers through which gases flow between an area above the deck and an area below the deck.

7. The tool of claim 1 wherein the mounting module further comprises a platform for carrying the transport system, and wherein:

the deck further comprises a first set of the positioning elements and a first set of the attachment elements at the first panel;

the platform comprises a second set of positioning elements and a second set of attachment elements;

the wet chemical processing station is carried by the deck and includes a plurality of first interface members and a plurality of first fasteners, and the first interface members being engaged with corresponding positioning elements of the first set of positioning elements and the first fasteners being engaged with corresponding attachment elements of the first set of attachment elements; and the transport system is carried by the platform and includes a plurality of second interface members and a plurality of second fasteners, and the second interface members being engaged with corresponding positioning elements of the second set of positioning elements and the second fasteners being engaged with corresponding attachments elements of the second set of attachment elements.

8. The tool of claim 7 wherein the wet chemical processing chamber comprises an electrochemical deposition chamber having a vessel, a first electrode in the vessel, a workpiece holder disposed relative to the vessel to hold a workpiece in a processing solution, and a second electrode carried by the workpiece holder to engage a workpiece.

9. The tool of claim 7 wherein the wet chemical processing chamber comprises a cleaning chamber having a fluid delivery system that directs a cleaning fluid onto a workpiece.

10. The tool of claim 7 wherein:

the wet chemical processing chamber is a first electrochemical deposition chamber comprising a first vessel, a first workpiece holder disposed relative to the first vessel to hold a workpiece in a processing solution, a first cathodic electrode disposed in one of the first vessel or the first workpiece holder, and a first anodic electrode disposed in the other of the first vessel or the first workpiece holder; and the tool further comprises a second electrochemical deposition chamber comprising a second vessel, a second workpiece holder disposed relative to the second vessel to hold a workpiece in a processing solution, a second cathodic electrode disposed in one of the second vessel or the second workpiece holder, and a second anodic electrode disposed in the other of the second vessel or the second workpiece holder.

11. The tool of claim 1 wherein the wet chemical processing chamber comprises an electrochemical deposition chamber having a vessel, a first electrode in the vessel, a workpiece holder disposed relative to the vessel to hold a workpiece in a processing solution, and a second electrode carried by the workpiece holder to engage a workpiece.

12. The tool of claim 1 wherein the wet chemical processing chamber comprises a cleaning chamber having a fluid delivery system that directs a cleaning fluid onto a workpiece.

13. The tool of claim 1 wherein:

the wet chemical processing chamber is a first electrochemical deposition chamber comprising a first vessel, a first workpiece holder disposed relative to the first vessel to hold a workpiece in a processing solution, a first cathodic electrode disposed in one of the first vessel or the first workpiece holder, and a first anodic electrode disposed in the other of the first vessel or the first workpiece holder; and the tool further includes a second wet chemical processing chamber comprising a cleaning chamber having a fluid delivery system that directs a cleaning fluid onto a workpiece.

14. The tool of claim 1 wherein the mounting module is configured to maintain the locations of the positioning elements to within 0.025 inch of predetermined reference locations for the positioning elements.

15. The tool of claim 1 wherein the mounting module is configured to maintain the locations of the positioning elements to within approximately 0.005 to 0.015 inch of predetermined reference locations for the positioning elements.

16. An integrated tool for wet chemical processing of microfeature workpieces, comprising:

a frame;

a mounting module attached to the frame, the mounting module comprising a deck having a rigid top panel with a plurality of positioning elements, a rigid bottom panel juxtaposed to the top panel bracing between the top panel and the bottom panel, and a chamber receptacle in the top panel and the bottom panel, wherein the top panel, the bracing and the bottom panel are fixed together to be dimensionally stable;

a wet chemical processing station attached to the deck, the wet chemical processing station having a first interface member engaged with at least one of the positioning elements, wherein a portion of the chamber is received in the chamber receptacle; and a workpiece transport system attached to the mounting module.

17. The tool of claim 16 wherein the top panel is superimposed over the bottom panel, and the deck further comprises a plurality of bolts clamping the top panel to one side of the bracing the clamping the bottom panel to another side of the bracing.

18. The tool of claim 16 wherein the bracing comprises horizontal joists, the top panel is attached to a top side of the joists, the bottom panel is superimposed under the top panel and attached to an underside of the joists, and the deck further comprises a plurality of bolts extending through the bracing to clamp the top panel and the bottom panel to the joists.

19. The tool of claim 18 wherein the top panel, the joists, and the bottom panel are configured to maintain the location of the positioning elements across the top panel to within 0.025 inch of predetermined reference locations for the positioning elements.

20. The tool of claim 18 wherein the top panel, the joists and the bottom panel are configured to maintain the locations of the positioning elements across the top panel to within 0.010 inch of predetermined reference locations for the positioning elements.

21. The tool of claim 18 wherein the top panel comprises stainless steel.

22. The tool of claim 18 wherein the top panel comprises a fiber reinforce composite.

23. An integrated tool for wet chemical processing of microfeature workpieces, comprising:

a frame a mounting module mounted to the frame, the mounting module comprising a deck having a rigid upper panel with a plurality of positioning elements and a plurality of attachment elements, a rigid lower panel superimposed under the upper panel, braces between the upper and lower panels, and a chamber receptacle in the upper and lower panels, wherein the upper panel, the braces and the lower panel are fixed together to be dimensionally stable;

a wet chemical processing station attached to the deck, the wet chemical processing station having a first interface member engaged with at least one of the positioning elements and a first fastener engaged with an attachment element, wherein a portion of the wet chemical processing station is received in the chamber receptacle; and a workpiece transport system attached to the mounting module, the transport system having a second interface member engaged with one of the positioning elements and a second fastener engaged with another attachment element.

24. The tool of claim 23 wherein the upper panel comprises stainless steel.

25. The tool of claim 23 wherein the upper panel comprises a fiber reinforced composite.

26. The tool of claim 23 wherein:

the first interface member of the wet chemical processing chamber is engaged with a corresponding positioning element of the upper panel of the deck; and the mounting module further comprises a platform having a plurality of the positioning elements and being fixedly disposed in the tool relative to the deck, and wherein the second interface member of the workpiece transport mechanism is engaged with a corresponding positioning element of the platform.

27. The tool of claim 23 wherein:

the braces comprise a plurality of joists, the upper panel is attached to one side of the joists and has a first set of the positioning elements and a first set of the attachment elements, and the lower panel is juxtaposed the first panel and attached to another side of the joists;

the mounting module further comprises a platform including a second set of positioning elements and a second set of attachment elements;

the wet chemical processing station is carried by the deck and includes a plurality of first interface members and a plurality of first fasteners, and the first interface members being engaged with corresponding positioning elements of the first set of positioning elements and the first fasteners being engaged with corresponding attachment elements of the first set of attachment elements; and the transport system is carried by the platform and includes a plurality of second interface members and a plurality of second fasteners, the second interface members being engaged with corresponding positioning elements of the second set of positioning elements and the second fasteners being engaged with corresponding attachments elements of the second set of attachment elements.

28. The tool of claim 27 wherein the wet chemical processing chamber comprises an electrochemical deposition chamber having a vessel, a first electrode in the vessel, a workpiece holder disposed relative to the vessel to hold a workpiece in a processing solution, and a second electrode carried by the workpiece holder to engage a workpiece.

29. The tool of claim 27 wherein the wet chemical processing chamber comprises a cleaning chamber having a fluid delivery system that directs a cleaning fluid onto a workpiece.

* * * * *